United States Patent [19]
Zuk et al.

[11] Patent Number: 6,163,240
[45] Date of Patent: Dec. 19, 2000

[54] MAGNETIC APPARATUS FOR MRI

[75] Inventors: Yuval Zuk, Haifa; Ehud Katznelson, Ramat Yishai; Yoav Katz, Rehovot; Haim Rotem, Mate Asher, all of Israel

[73] Assignee: Odin Medical Technologies Ltd., Yokneam Elite, Israel

[21] Appl. No.: 09/161,336

[22] Filed: Sep. 25, 1998

Related U.S. Application Data

[60] Provisional application No. 60/059,659, Sep. 25, 1997.

[51] Int. Cl.[7] .................................. H01F 5/00; G01V 3/00
[52] U.S. Cl. ..................... 335/299; 324/318; 324/319; 324/320; 335/296; 335/302; 335/306
[58] Field of Search .......................... 335/216, 296–306; 324/318–320; 600/410, 421, 422

[56] References Cited

U.S. PATENT DOCUMENTS

| | | |
|---|---|---|
| H1615 | 12/1996 | Leupold . |
| 4,341,220 | 7/1982 | Perry . |
| 4,608,977 | 9/1986 | Brown . |
| 4,695,802 | 9/1987 | Zijlstra ..................................... 324/319 |
| 4,829,252 | 5/1989 | Kaufman . |
| 4,862,086 | 8/1989 | Maeda . |
| 4,875,485 | 10/1989 | Matsutani . |
| 5,134,374 | 7/1992 | Breneman et al. . |
| 5,153,517 | 10/1992 | Oppelt et al. ........................... 324/322 |
| 5,241,272 | 8/1993 | Friedrich ................................. 324/318 |
| 5,304,933 | 4/1994 | Vavrek et al. . |
| 5,332,971 | 7/1994 | Aubert . |
| 5,365,927 | 11/1994 | Roemer et al. . |
| 5,390,673 | 2/1995 | Kikinis . |
| 5,410,287 | 4/1995 | Laskaris et al. . |
| 5,428,292 | 6/1995 | Dorri et al. . |
| 5,490,509 | 2/1996 | Carlson et al. . |
| 5,570,073 | 10/1996 | Muller . |
| 5,623,241 | 4/1997 | Minkoff . |
| 5,675,305 | 10/1997 | DeMeester et al. ..................... 335/302 |
| 5,677,630 | 10/1997 | Laskaris et al. . |
| 5,696,449 | 12/1997 | Boskamp . |

OTHER PUBLICATIONS

A description of ,"HSP 50215 Harris Semiconductor Corporation,FI, U.S.A." 1 page, No Date.

A description of,"HSP 50214 Harris Semiconductor Corporation ,FI, U.S.A" 1page, No Date.

Faulkner et al., "Guidelines for Establishing a Virtual Reality Lab", IEEE Engineering in Medicine and in Biology, Mar. Apr. 1996 pp. 86–93.

*Primary Examiner*—Michael L. Gellner
*Assistant Examiner*—Raymond Barrera
*Attorney, Agent, or Firm*—Eitan, Pearl, Latzer & Cohen-Zedek

[57] ABSTRACT

Magnetic apparatus for MRI/MRT probes and methods for construction thereof are disclosed. One embodiment includes a pair of opposed magnet assemblies defining an open region therebetween, a transmitting RF coil having at least a portion thereof disposed within the open region, at least one receiving RF coil disposed within the open region and X,Y and Z gradient coils. At least one of the X,Y and Z gradient coils is disposed outside of the open region. Another embodiment of the apparatus includes a single magnet assembly having a first surface and a second surface opposing the first surface, a transmitting RF coil having at least a portion thereof opposing the first surface, at least one receiving RF coil and X,Y and Z gradient coils. At least one of the X,Y and Z gradient coils opposes the second surface. In another embodiment the magnet assembly generates a permanent z-gradient magnetic field and therefore includes only X and Y gradient coils, at least one of which opposes the second surface. The apparatuses may also include one or more shim coils.

21 Claims, 22 Drawing Sheets

MAGNETIC APPARATUS FOR MRI

REFERENCE TO RELATED APPLICATIONS:

This application claims priority of and the benefit of U.S. provisional application Ser. No. 60/059,659, filed Sep. 25, 1997.

FIELD OF THE INVENTION

The present invention is generally related to the fields of magnetic resonance imaging (MRI) and magnetic resonance therapy (MRT).

BACKGROUND OR THE INVENTION

MRI systems for performing whole body imaging usually employ large magnets which effectively surround the patient. Such magnets are usually large superconductor magnets which are expensive and difficult to maintain. MRI systems for performing local imaging of specific body parts or organs are known in the art.

U.S. patent application Ser. No. 08/898,773, now U.S. Pat. No. 5,900,793 to Katznelson et al., filed Jul. 23, 1997 and entitled "PERMANENT MAGNET ASSEMBLIES FOR USE IN MEDICAL APPLICATIONS", now U.S. Pat. No. 5,900,793 and incorporated herein by reference discloses, inter alia, compact permanent magnet assemblies for use in medical applications including MRI and/or MRT.

A typical application using an intra-operative MRI system is brain surgery. Reference is now made to FIG. 1 which is a schematic perspective view of a small organ dedicated MRI probe useful in brain surgery. The MRI probe 1 includes two annular permanent magnet assemblies 2 and 4 connected by a frame 3. The frame 3 and the magnet assemblies 2 and 4 are shaped for imaging the brain of a patient 6. During MRI assisted brain surgery or MRT, the head of the patient 6 is positioned between the two magnet assemblies 2 and 4.

Reference is now made to FIG. 2 which is a schematic isometric view of the two permanent magnet assemblies 2 and 4 of FIG. 1. Each of the magnet assemblies 4 and 2 includes three preferably concentric annular permanent magnets 4a, 4b, 4c and 2a, 2b, 2c (not shown in drawing). The annular permanent magnets 4a, 4b and 4c are offset from each other along the axis 12, and the annular permanent magnets 2a, 2b and 2c (not shown) are also offset from each other along the axis 12 as disclosed in U.S. Pat. No. 5,900,793 to Katznelson et al., now U.S. Pat. 5,900,793.

The axis 12 is the axis of symmetry of both magnet assemblies 2 and 4, passing through their centers. The axis 12 coincides with the z-axis along which the main magnetic field generated by the magnet assemblies 2 and 4 is oriented.

In order to reduce eddy currents each one of the concentric annular permanent magnets 4a, 4b, 4c, 2a, 2b and 2c is formed from segments 24 each of which is permanently magnetized in a known manner and then attached to the neighboring segments using an electrically non-conducting glue (not shown) or non-conductive spacers (not shown). For example, the segments 24 can be made from a neodymium-iron-boron (Nd—Fe—B) alloy. However, the segments 24 can be made from any other alloy or ceramic material suitable for forming permanent magnets of sufficient magnetic field strength. Preferably, the material from which the segments 24 are made should have a relatively low electrical conductivity.

The magnet assemblies 2 and 4 joined together by frame 3 (not shown in FIG. 2) define a region 16 having therein a volume 18 of substantially uniform magnetic field, between the pair of magnet assemblies 2 and 4.

The MRI probe 1 further includes Gradient coils (not shown) for generating gradient fields, shim coils (not shown) for active shimming of the main magnetic field, RF coils (not shown), a temperature control system (not shown) and an RF shield (not shown).

Ordinarily, the gradient fields are generated by a set of coils, through which a current of an adequate magnitude flows. During the periods of building up and decay of the currents, the temporal change of the magnetic flux, originally generated by the currents, creates eddy currents in conductive materials situated in their vicinity such as soft iron parts or permanent magnet parts used in prior art MRI permanent magnets or the aluminum enclosures of the cooling systems used in super-conducting magnets of MRI systems. The eddy currents generated by the gradient coil magnetic flux changes, generate secondary magnetic fields which may interfere with the primary gradient fields and affect their precision in encoding the spatial information.

In prior art MRI devices, the gradient coils are located within the internal free volume situated in the main magnet, where the imaged body is also introduced. To attenuate the effect of the spurious eddy currents, prior art MRI devices may use shielded gradient coils or pre-emphasis circuits which modify gradient amplifier demand in order to compensate for eddy currents. In small organ dedicated MRI probes and in MRI probes adapted for intra-operative use such as the MRI probe 1 of FIG. 1, the dimensions of the region 16 (best seen in FIG. 2) for accommodating the organ to be imaged are limited by practical considerations. Generally, the design of such MRI systems involves a tradeoff between maximizing the intensity and homogeneity of the magnetic field in as large an imaging volume as possible and providing maximal accessibility of the surgeon to the organ undergoing surgery. For example, the MRI probe 1 (FIGS. 1 and 2) is designed to maximize the size of the volume 18 of homogenous magnetic field while keeping the size of the magnet assemblies 2 and 4 minimal while allowing enough space for positioning the shoulders of the patient 6. If one tries to increase the space available for the shoulders of the patient 6 by increasing the distance between the magnet assemblies 2 and 4 along the axis 12, the resulting decrease in the strength and homogeneity of the magnetic field will have to be compensated. The magnetic field can be compensated by increasing the thickness of the annular permanent magnets 4a, 4b, 4c of FIG. 2 and 2a, 2b and 2c (not shown in FIG. 2).

Increasing the thickness of the annular permanent magnets 4a, 4b, 4c, 2a, 2b and 2c (not shown) is practically limited since their magnetic field depends non-linearly on their thickness. Thus, increasing the thickness of an annular permanent magnet above a certain value, results in a negligible contribution to the magnetic field strength.

The magnetic field can also be compensated by increasing the size and diameter of the magnet assemblies 2 and 4. However, increasing the diameter of the magnet assemblies 2 and 4 may in turn shift the location of the volume 18 relative to the desired position of the head of the patient 6. The shifting may also prevent access to and imaging of the lower part of the brain, affecting the types of surgery that can be performed using the probe 1.

Thus, placing the gradient coils and/or shim and RF coils within the already restricted region 16 between the magnet assemblies 2 and 4, limits even further the space available for positioning the organ to be imaged and may hinder access to the organ undergoing surgery and the placing and manipulating of surgical instruments within that organ during surgery.

Furthermore, in MRI systems using permanent magnets, if the gradient coils are positioned in close proximity to the permanent magnets, the heat developed in the resistive gradient coils by the currents flowing within the coils may heat the permanent magnet. The heat generated by the gradient coils may thus cause local temperature increase in the permanent magnets. Such temperature changes are undesirable since the field generated by permanent magnets is highly susceptible to large variations induced by local temperature changes.

MRI systems based on permanent magnets such as the MRI probe 1 of FIG. 1 or the MRI probe of FIG. 2, do not include electrically conducting structures operating as magnetic flux return structures. This fact, in addition to the segmented structure of the annular permanent magnets 4a, 4b, 4c and 2a, 2b and 2c (not shown) and the intrinsic low conductivity of the Nd—Fe—B alloy from which they are made, substantially reduce the spurious eddy current problem.

Whole body MRI/MRT systems typically use a fixed installation RF cage for preventing magnetic, electromagnetic and electrical noise from the outside from penetrating into the imaging volume inside the probe and interfering with the weak NMR signals generated during imaging. In addition, the RF cage is also used to reduce the leakage of the RF radiation generated within the probe during imaging to prevent disturbances to other electrical devices used near the MRI probe.

Unfortunately, for practical reasons, large fixed installation RF cages or RF rooms cannot always be used small organ dedicated MRI or MRT probes of the type used for intra-operative imaging such as the MRI probe 1 of FIG. 1. For example, while the small organ dedicated MRI probe 1 may be operated within a large shielded RF room, this will necessitate the use of special expensive shielded surgical equipment that is designed to create minimal RFI disturbances so as not to interfere with the operation of the MRI probe 1.

SUMMARY OF THE INVENTION

There is therefore provided, in accordance with a preferred embodiment of the present invention, electromagnetic apparatus for use in an MRI device. The probe includes a first permanent magnet assembly having a first surface and a second surface thereof. The probe also includes a second permanent magnet assembly having a third surface and a fourth surface thereof. The second permanent magnet assembly opposes the first permanent magnet assembly such that the second surface and the third surface define an open region therebetween, for producing a predetermined volume of substantially uniform magnetic field extending in a first direction parallel to a first axis. The volume is disposed within the open region.

The probe also includes an energizable transmitting RF coil for producing an RF electromagnetic field within the volume, an energizable z-gradient coil for producing a magnetic field gradient extending within the open region in the first direction and parallel to the first axis, an energizable x-gradient coil for producing a magnetic field gradient extending within the open region in parallel to a second axis orthogonal to the first axis, and an energizable y-gradient coil for producing a magnetic field gradient extending within the open region in parallel to a third axis orthogonal to the first axis and the second axis. At least one of the x-gradient coil, y-gradient coil and z-gradient coil is positioned outside of the open region.

Furthermore, in accordance with another preferred embodiment of the present invention, the transmitting RF coil includes at least a first portion thereof positioned within the open region adjacent the second surface and at least a second portion thereof positioned within the open region adjacent the third surface. The first portion and the second portion of the transmitting RF coil are electrically connected in series.

Furthermore, in accordance with yet another preferred embodiment of the present invention, the transmitting RF coil further includes a third portion thereof including current return conductors positioned outside of the open region and adjacent the first surface, and at least a fourth portion thereof including current return conductors positioned outside of the open region and adjacent the fourth surface to increase the efficiency of the transmitting RF coil. The first portion, second portion, third portion and fourth portion of the transmitting RF coil are electrically connected in series.

Furthermore, in accordance with another preferred embodiment of the present invention, the apparatus further includes an energizable shim coil for improving the homogeneity of the substantially uniform magnetic field.

Furthermore, in accordance with another preferred embodiment of the present invention, the shim coil includes a first shim coil portion positioned outside of the open region and opposed to the first surface of the first permanent magnet assembly, and a second shim coil portion positioned outside of the open region and opposed to the fourth surface of the second permanent magnet assembly.

Further still, in accordance with another preferred embodiment of the present invention, the first shim coil portion and the second shim coil portion are electrically connected in series.

Furthermore, in accordance with another preferred embodiment of the present invention, at least one of the x-gradient coil, y-gradient coil and z-gradient coil includes a first coil portion thereof opposed to the first surface of the first permanent magnet assembly and a second complementary coil portion thereof opposed to the fourth surface of the second permanent magnet assembly.

Furthermore, in accordance with another preferred embodiment of the present invention, the first coil portion and the second coil portion of the at least one of the x-gradient coil, y-gradient coil and z-gradient coil are electrically connected in series.

Furthermore, in accordance with another preferred embodiment of the present invention, the first coil portion and the second coil portion of at least one of the x-gradient coil, y-gradient coil and z-gradient coil are substantially planar printed circuits, the first coil portion is assembled into a first multi-layer printed circuit assembly opposed to the first surface, and the second coil portion is assembled into a second multi-layer printed circuit assembly opposed to the fourth surface.

Furthermore, in accordance with another preferred embodiment of the present invention, each of the first multi-layer printed circuit assembly and second multi-layer printed circuit assembly further includes a portion of an energizable shim coil, the portion of the shim coil is a substantially planar printed circuit.

Furthermore, in accordance with another preferred embodiment of the present invention, the apparatus further includes a mounting of low permeability material for mounting the first permanent magnet assembly and the second permanent magnet assembly in opposition to each other.

Furthermore, in accordance with another preferred embodiment of the present invention, the first permanent magnet assembly includes a first annular permanent magnet with a first and a second surface thereof. The first surface of the first annular permanent magnet is of a first magnetic polarity and the second surface of the first annular permanent magnet is of a second magnetic polarity. The first annular permanent magnet has an inside diameter. The first annular permanent magnet has at least a portion of the first surface of the first annular magnet lying in a first plane to provide a first magnetic field in the open region. The first magnetic field has a zero rate of change in a first direction at a first point in the open region. The first magnet assembly also includes at least a second annular permanent magnet with a first and a second surface thereof. The first surface of the second annular magnet is of the first magnetic polarity and the second surface of the second annular permanent magnet is of the second magnetic polarity. The second annular permanent magnet has an outside diameter which is smaller than the inside diameter of the first annular permanent magnet, with at least a portion of the first surface of the second annular magnet lying in a second plane spaced from the first plane to provide a second magnetic field whereby the second magnetic field is superimposed upon the first magnetic field in the open region, having a zero rate of change in the first direction at a second point different from the first point. The second permanent magnet assembly includes a third annular permanent magnet with a first and a second surface thereof, the first surface of the third annular permanent magnet is of the second magnetic polarity and the second surface of the third annular permanent magnet is of the first magnetic polarity. The third annular permanent magnet has an inside diameter, the third annular permanent magnet has at least a portion of the first surface of the third annular magnet lying in a third plane to provide a third magnetic field, whereby the third magnetic field is superimposed on the first and second magnetic fields in the open region, having a zero rate of change in the first direction at a third point different from the first and second points. The second magnet assembly also includes at least a fourth annular permanent magnet having a first and a second surface thereof, the first surface of the fourth annular magnet is of the second magnetic polarity and the second surface of the fourth annular permanent magnet is of the first magnetic polarity. The fourth annular permanent magnet has an outside diameter which is smaller than the inside diameter of the third annular permanent magnet, with at least a portion of the first surface of the fourth annular permanent magnet lying in a fourth plane spaced from the third plane to provide a fourth magnetic field, whereby the fourth magnetic field is superimposed upon the first, second and third magnetic fields, in the open region, having a zero rate of change in the first direction at a fourth point different from the first, second and third points.

Furthermore, in accordance with another preferred embodiment of the present invention, the first axis passes through the centers of the first annular permanent magnet, the at least second annular permanent magnet, the third annular permanent magnet and the at least fourth annular permanent magnet.

Furthermore, in accordance with another preferred embodiment of the present invention, the first annular permanent magnet, the at least second annular permanent magnet, the third annular permanent magnet and the at least fourth annular permanent magnet are rare-earth permanent magnets.

Furthermore, in accordance with another preferred embodiment of the present invention, the rare-earth permanent magnets are neodymium-iron-boron alloy permanent magnets.

Furthermore, in accordance with another preferred embodiment of the present invention, at least one of the first annular permanent magnet, the at least second annular permanent magnet, the third annular permanent magnet and the at least fourth annular permanent includes a plurality of segments attached to adjacent segments using an electrically non-conductive adhesive.

Furthermore, in accordance with another preferred embodiment of the present invention, the segments are equiangular segments.

Furthermore, in accordance with another preferred embodiment of the present invention, the segments have a trapezoidal cross-section in a plane orthogonal to the first direction.

Furthermore, in accordances with another preferred embodiment of the present invention, the z-gradient coil includes a first gradient coil portion concentrically disposed between the first annular permanent magnet and the at least second annular permanent magnet, and a second gradient coil portion concentrically disposed between the third annular permanent magnet and the at least fourth annular permanent magnet. The first and second gradient coil portions have their longitudinal axes coincident with the first axis.

Furthermore, in accordance with another preferred embodiment of the present invention, the apparatus further including at least one receiving RF coil placeable adjacent to an organ or body part disposed within the open region.

Furthermore, in accordance with another preferred embodiment of the present invention, the transmitting RF coil is a linearly polarizing RF coil.

Furthermore, in accordance with another preferred embodiment of the present invention, the transmitting RF coil is a circularly polarizing RF coil.

Furthermore, in accordance with another preferred embodiment of the present invention, the circularly polarizing RF coil is a quadrature-hybrid RF coil.

Furthermore, in accordance with another preferred embodiment of the present invention, the first permanent magnet assembly includes a first plurality of nested polygonally or elliptically shaped annular permanent magnets, and the second permanent magnet assembly includes a second plurality of nested polygonally or elliptically shaped annular permanent magnets the first plurality being opposed to the second plurality such that the second plurality is configured as a mirror image of the first plurality.

Furthermore, in accordance with another preferred embodiment of the present invention, at least one of the x-gradient coil, y-gradient coil and z-gradient coil is positioned below the first permanent magnet assembly and the second permanent magnet assembly.

Furthermore, in accordance with another preferred embodiment of the present intention, the x-gradient coil, the y-gradient coil and the z-gradient coil are planar printed circuit coil boards assembled within a single multi-layer printed circuit assembly positioned underneath the first permanent magnet assembly and the second permanent magnet assembly.

There is further provided, in accordance with a preferred embodiment of the present invention, electromagnetic apparatus for use in an MRI device. The apparatus includes a permanent magnet assembly having at least a first surface defining a first side of the permanent magnet assembly and a second surface defining a second side of the permanent magnet assembly opposed to the first side, for producing a predetermined volume of substantially uniform magnetic field extending in a first direction beyond the first surface. The apparatus further includes an energizable transmitting RF coil for producing an RF electromagnetic field within the volume. At least a portion of the RF coil is positioned adjacent the first surface of the permanent magnet assembly. The apparatus also includes an energizable z-gradient coil for producing a magnetic field gradient extending within the volume in the first direction parallel to a first axis. The apparatus also includes an energizable x-gradient coil for producing a magnetic field gradient extending within the volume parallel to a second axis orthogonal to the first axis. The apparatus also includes an energizable y-gradient coil for producing a magnetic field gradient extending within the volume parallel to a third axis orthogonal to the first axis and to the second axis. At least one of the x-gradient coil, y-gradient coil and z-gradient coil is positioned opposing the second surface of the permanent magnet assembly.

Furthermore, in accordance with another preferred embodiment of the present invention, the apparatus further includes at least one energizable shim coil for improving the homogeneity of the substantially uniform magnetic field.

Furthermore, in accordance with another preferred embodiment of the present invention, the at least one shim coil is a substantially planar coil opposing the second surface of the permanent magnet assembly.

Furthermore, in accordance with another preferred embodiment of the present invention, the x-gradient coil, the y-gradient coil and the z-gradient coil are substantially planar printed circuits assembled within a substantially planar multi-layer printed circuit assembly. The multi-layer printed circuit assembly is disposed on the second side of the permanent magnet assembly facing the second surface.

Furthermore, in accordance with another preferred embodiment of the present invention, the multi-layer printed circuit assembly further includes at least one energizable shim coil. The at least one shim coil is a substantially planar printed circuit.

Furthermore, in accordance with another preferred embodiment of the present invention, the permanent magnet assembly includes a first annular permanent magnet having an upper and a lower surface thereof. The upper surface of the first annular permanent magnet is of a first magnetic polarity and the lower surface of the first annular permanent magnet is of a second magnetic polarity. The first annular permanent magnet has an inside diameter. The first permanent magnet has at least a portion of the upper surface of the first annular magnet lying in a first plane and providing a first magnetic field in the predetermined volume. The first magnetic field has a zero rate of change in the first direction at a first point. The permanent magnet assembly further includes at least a second annular permanent magnet having an upper and a lower surface thereof. The upper surface of the at least second annular permanent magnet is of the first magnetic polarity and the lower surface of the at least second annular permanent magnet is of the second magnetic polarity. The at least second annular permanent magnet has an outside diameter which is smaller than the inside diameter of the first annular permanent magnet. The at least second annular permanent magnet provides a second magnetic field. The permanent magnet assembly also includes low permeability material interconnecting the first annular permanent magnet with the second annular permanent magnet, so that at least a portion of the upper surface of the second annular permanent magnet is in a second plane spaced from the first plane. The second magnetic field is superimposed upon the first magnetic field, in the predetermined volume, having a zero rate of change in the first direction at a second point different from the first point.

Furthermore, in accordance with another preferred embodiment of the present invention, the first axis passes through the center points of the first annular permanent magnet and the at least second annular permanent magnet.

Furthermore, in accordance with another preferred embodiment of the present invention, the first annular permanent magnet and the at least second annular permanent magnet are rare-earth permanent magnets.

Furthermore, in accordance with another preferred embodiment of the present invention, the rare-earth permanent magnets are neodymium-iron-boron alloy permanent magnets.

Furthermore, in accordance with another preferred embodiment of the present invention, at least one of the first annular permanent magnet and the at least second annular permanent magnet includes a plurality of segments attached to adjacent segments using an electrically non-conductive adhesive.

Furthermore, in accordance with another preferred embodiment of the present invention, the segments are equiangular segments.

Furthermore, in accordance with another preferred embodiment of the present invention, the segments have a trapezoidal cross-section in a plane orthogonal to the first direction.

Furthermore, in accordance with another preferred embodiment of the present invention, the z-gradient coil is an extended gradient coil concentrically disposed between the first annular permanent magnet and the at least second annular permanent magnet, the z-gradient coil has a longitudinal axis coincident with the first axis.

Furthermore, in accordance with another preferred embodiment of the present invention, the apparatus further includes at least one receiving RF coil positioned on the first side of the permanent magnet assembly and placeable adjacent to an organ or body part to be imaged using the apparatus.

Furthermore, in accordance with another preferred embodiment of the present invention, the transmitting RF coil is a linearly polarizing RF coil.

Furthermore, in accordance with another preferred embodiment of the present invention, the transmitting RF coil is a circularly polarizing RF coil.

Furthermore, in accordance with another preferred embodiment of the present invention, at least a portion of the transmitting RF coil is positioned on the second side of the permanent magnet assembly opposing the second surface of the permanent magnet assembly to improve the efficiency of the transmitting RF coil.

There is also provided, in accordance with another preferred embodiment of the present invention, electromagnetic apparatus for use in an MRI device. The apparatus includes a permanent magnet assembly having a first surface and a second surface for producing a predetermined volume having a magnetic field varying substantially linearly along a first axis. The volume extends in a first direction beyond the first surface along the first axis. The magnetic field is substantially uniform in any plane which is included within the predetermined volume and which is orthogonal to the first direction within the predetermined volume. The apparatus further includes an energizable transmitting RF coil for transmitting RF radiation. The RF coil has at least one portion thereof positioned opposing the first surface of the permanent magnet assembly. The apparatus also includes an energizable x-gradient coil for producing a magnetic field gradient along a second axis orthogonal to the first axis. The apparatus also includes an energizable y-gradient. coil for producing a magnetic field gradient along a third axis orthogonal to the first axis and to the second axis. At least one of the x-gradient coil and y-gradient coil is positioned opposing the second surface of the permanent magnet assembly.

Furthermore, in accordance with another preferred embodiment of the present invention, the apparatus further includes at least one receiving RF coil positioned on the first side of the permanent magnet assembly and placeable adjacent to an organ or body part to be imaged using the apparatus.

There is also provided, in accordance with another preferred embodiment of the present invention, a method for constructing electromagnetic apparatus for use in an MRI device. The method includes the steps of providing a first permanent magnet assembly having a first surface and a second surface thereof, providing a second permanent magnet assembly having a third surface and a fourth surface thereof, positioning the second permanent magnet assembly opposite the first permanent magnet assembly such that the second surface and the third surface define an open region therebetween, for producing a predetermined volume of substantially uniform magnetic field extending in a first direction parallel to a first axis, the volume is disposed within the open region, providing an energizable transmitting RF coil for producing an RF electromagnetic field within the volume, providing an energizable z-gradient coil for producing a magnetic field gradient extending within the open region in the first direction and parallel to the first axis, providing an energizable x-gradient coil for producing a magnetic field gradient extending within the open region in parallel to a second axis orthogonal to the first axis, providing an energizable y-gradient coil for producing a magnetic field gradient extending within the open region in parallel to a third axis orthogonal to the first axis and the second axis, providing at least one receiving RF coil placeable adjacent to an organ or body part to be imaged for receiving RF signals from the organ or body part, and positioning at least one of the x-gradient coil, y-gradient coil and z-gradient coil outside of the open region for reducing the loading of the transmitting RF coil and the at least one receiving RF coil by the at least one of the x-gradient coil, y-gradient coil and z-gradient coil.

There is further provided, in accordance with another preferred embodiment of the present invention, a method for constructing electromagnetic apparatus for use in an MRI device. The method includes the steps of providing a permanent magnet assembly having at least a first surface defining a first side of the permanent magnet assembly and a second surface defining a second side of the permanent magnet assembly opposed to the first side, for producing a predetermined volume of substantially uniform magnetic field extending in a first direction beyond the first surface, providing an energizable transmitting RF coil for producing an RF electromagnetic field within the volume, positioning at least a portion of the transmitting RF coil adjacent the first surface of the permanent magnet assembly, providing at least one receiving RF coil placeable adjacent to an organ or body part to be imaged for receiving RF signals from the organ or body part, providing an energizable z-gradient coil for producing a magnetic field gradient extending within the volume in the first direction parallel to a first axis, providing an energizable x-gradient coil for producing a magnetic field gradient extending within the volume parallel to a second axis orthogonal to the first axis, providing an energizable y-gradient coil for producing a magnetic field gradient extending within the volume parallel to a third axis orthogonal to the first axis and to the second axis, and positioning at least one of the x-gradient coil, y-gradient coil and z-gradient coil opposite the second surface of the permanent magnet assembly for reducing the loading of the transmitting RF coil and the at least one receiving RF coil by the at least one of the x-gradient coil, y-gradient coil and z-gradient coil.

Finally, there is provided, in accordance with another preferred embodiment of the present invention, a method for constructing electromagnetic apparatus for use in an MRI device. The method includes the steps of providing a permanent magnet assembly having a first surface and a second surface for producing a predetermined volume having a magnetic field varying substantially linearly along a first axis, the volume extends in a first direction beyond the first surface along the first axis, the magnetic field is substantially uniform in any plane included within the predetermined volume and orthogonal to the first direction within the predetermined volume, providing an energizable transmitting RF coil for transmitting RF radiation, positioning the transmitting RF coil such that at least one portion thereof opposes the first surface of the permanent magnet assembly, providing at least one receiving RF coil placeable adjacent to an organ or body part to be imaged for receiving RF signals from the organ or body part, providing an energizable x-gradient coil for producing a magnetic field gradient along a second axis orthogonal to the first axis, providing an energizable y-gradient coil for producing a magnetic field gradient along a third axis orthogonal to the first axis and to the second axis, and positioning at least one of the x-gradient coil and y-gradient coil opposite the second surface of the permanent magnet assembly for reducing the loading of the transmitting RF coil and the at least one receiving RF coil by the at least one of the x-gradient coil and y-gradient coil.

BRIEF DESCRIPTION OF THE DRAWINGS

The present invention will be described with reference to the accompanying drawings, wherein like reference numerals identify like or corresponding components.

In the drawings.

DETAILED DESCRIPTION OF THE DRAWINGS

Figure 3:
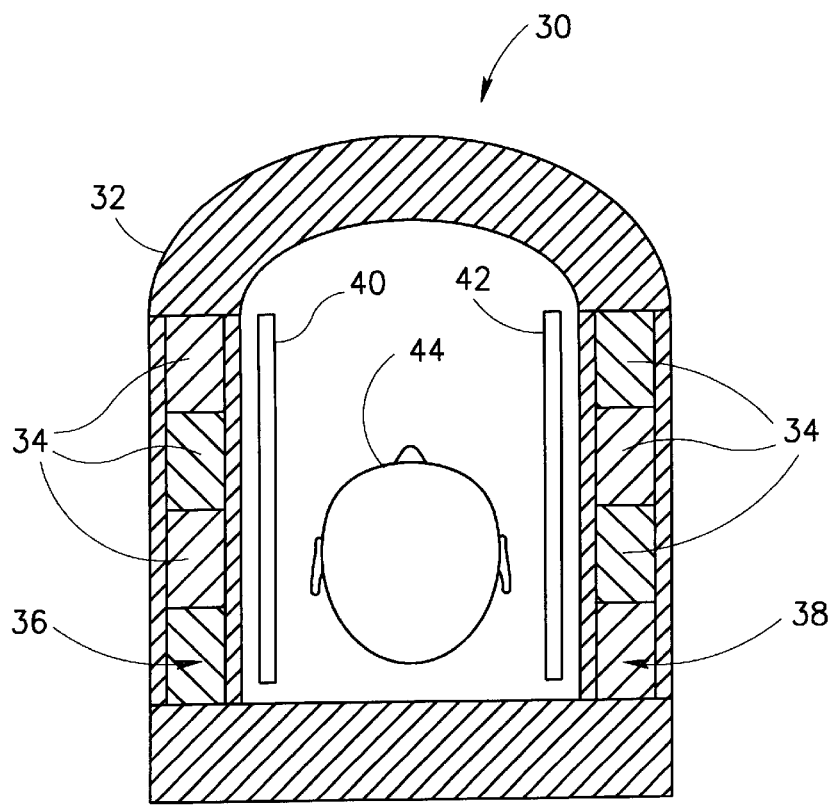
FIG. 3 is a schematic cross section illustrating part of a prior art MRI device using permanent magnets.

Reference is now made to FIG. 3 which is a schematic cross section illustrating part of a prior art MRI device 30 using permanent magnets. The MRI device 30 includes two permanent magnets 36 and 38. Each of the permanent magnets 36 and 38 is constructed from segments 34. The permanent magnets 36 and 34 are encased in a structure 32 made of a conducting metal such as soft iron and operating as a magnetic flux return circuit. The MRI device 30 further includes two multi-layer printed circuits 40 and 42 positioned in the volume between the two permanent magnets 36 and 38. The multi-layer printed circuits include the gradient coils. The MRI device 30 also includes RF coils (not shown) and the shim coils (not shown) of the MRI device 30. Each of the multi-layer printed circuits 40 and 42 is positioned in close proximity to the permanent magnets 36 and 38, respectively, such that enough room is left for positioning the organ 44 such as the knee or head of a patient between the multi-layer printed circuits 40 and 42.

Figure 4:
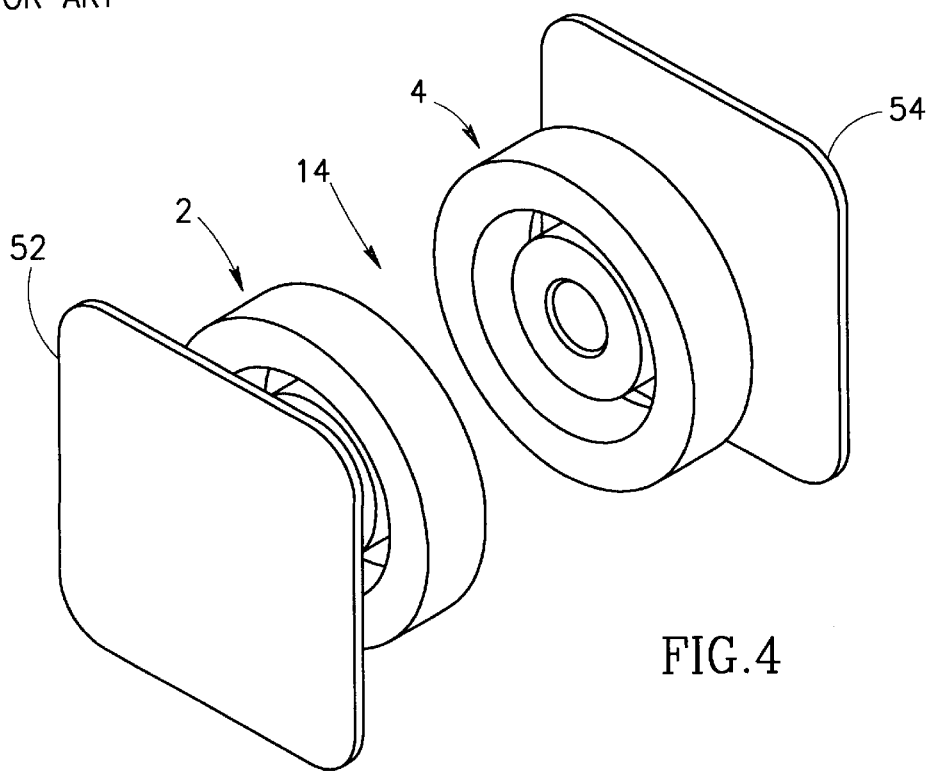
FIG. 4 is an isometric view illustrating part of an MRI probe using permanent magnets and having external gradient coils, in accordance with a preferred embodiment of the present invention.

Reference is now made to FIG. 4 which is an isometric view illustrating part of an MRI probe using permanent magnets and having external gradient coils, in accordance with a preferred embodiment of the present invention.

Figure 2:
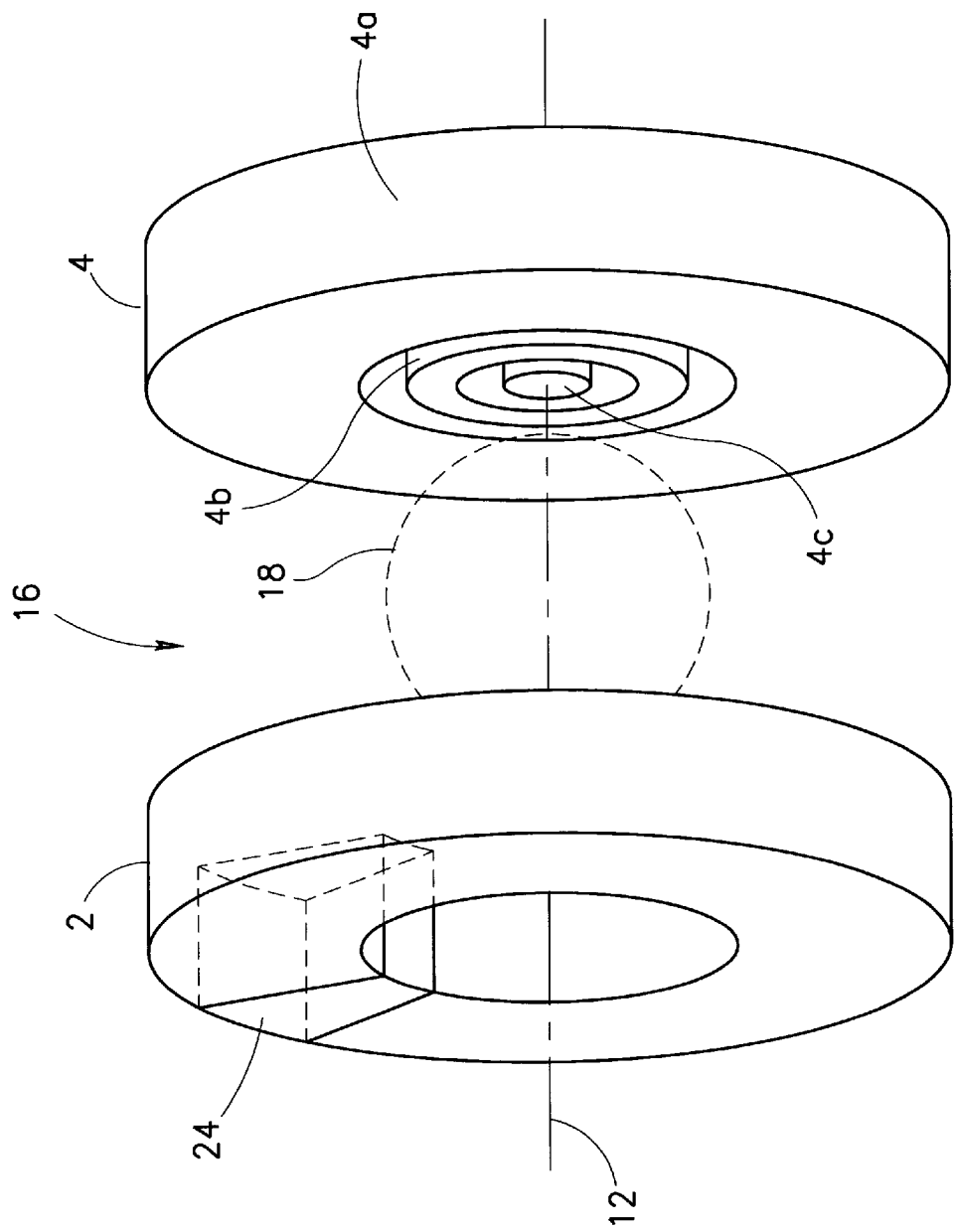
FIG. 2 is a schematic isometric view illustrating the two permanent magnet assemblies of FIG. 1.

The part of the MRI probe illustrated in FIG. 4 includes the two annular permanent magnet assemblies 2 and 4 of FIG. 2 and two multi-layer printed circuit assemblies 52 and 54. The multi-layer printed circuit assemblies 52 and 54 each include x, y and z-gradient coils (not shown), and shim coils (not shown). The MRI probe of FIG. 4 also includes RF coils (not shown).

In contrast to the prior art Permanent magnet MRI device 30 of FIG. 3 in which the multi-layer printed circuits 40 and 42 including the gradient coils are positioned in the volume between the two permanent magnets 36 and 38, the multi-layer printed circuit assemblies 52 and 54 of FIG. 4 are positioned outside of the region 14 defined between the two permanent magnet assemblies 2 and 4.

It is noted that, the natural inclination of the designer is to place the gradient coils of the multi-layer printed circuit assemblies 52 and 54 between the magnet assemblies 2 and 4, placing them closer to the imaging volume. This will make the relative influence of the eddy currents in the more distant magnet assemblies 2 and 4 on the gradient fields, smaller.

Additionally, in prior art MRI systems having a large structure of an electrically conductive metal such as iron, which surrounds the magnet poles, the gradient coils cannot be placed outside of the magnet poles since the conductive metal will absorb most of the gradient field.

Moreover, the gradient field strength is inversely proportional to the third power of the distance of the gradient coil from the center of the imaging volume. If the permanent magnets are large, the designer will tend to place the gradient coils as close as possible to the imaging volume, and avoid placing them outside the region between the permanent magnets, since enormous amplifiers will be required to drive gradient coils which are placed outside of the region between the permanent magnets because of the low efficiency of the gradient coil.

However, if the multi-layer printed circuit assemblies 52 and 54 are positioned between the magnet assemblies 2 and 4, they take up precious space between the magnet assemblies 2 and 4. Moreover, if the multi-layer printed circuit assemblies 52 and 54 are placed in close proximity to the permanent magnet assemblies 2 and 4, respectively, the heat generated by the currents flowing in all the gradient coils within the multi-layer printed circuit assemblies 52 and 54 may raise the temperature of the proximal surfaces of the magnet assemblies 2 and 4, affecting significantly the basic magnetic field.

The neodymium-iron-boron (Nd—Fe—B) alloy of which the segments 24 (not shown in FIG. 4) comprising the annular permanent magnets (not shown) of the permanent magnet assemblies 2 and 4 are made, features a relatively low electrical conductivity. Hence, the eddy current effect is relatively low, to begin with.

Moreover, the construction of the annular permanent magnets included in the permanent magnet assemblies 2 and 4 from insulated segments 24 (best seen in FIG. 2), reduces even more the influence of the eddy current effect because of the discontinuation of the current flow path in the annular permanent magnets. Thus, because the design of the magnet assemblies significantly reduces the eddy current spurious effects, it is possible to position the x, y and z gradient coils outside the region 14, without significantly increasing the magnitude of the eddy currents effects.

Figure 5:
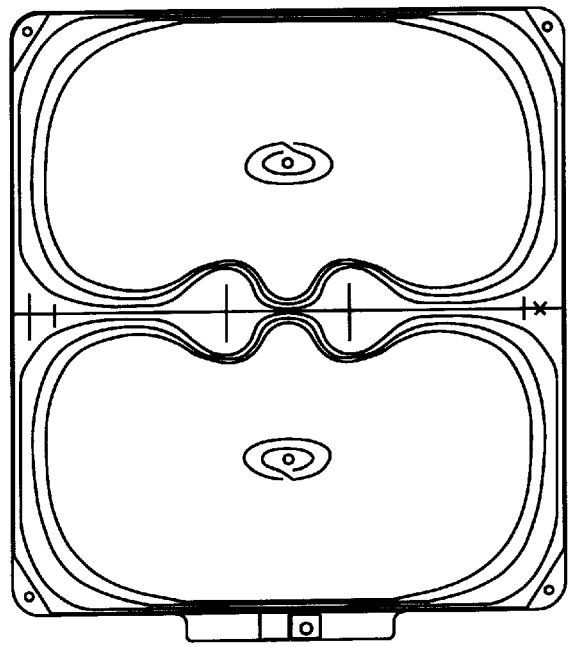
FIGS. 5–7 are front views schematically illustrating printed circuit layout designs for an x-coil, y-coil and z-coil, respectively, useful in the MRI probe of FIG. 4.
Figure 6:
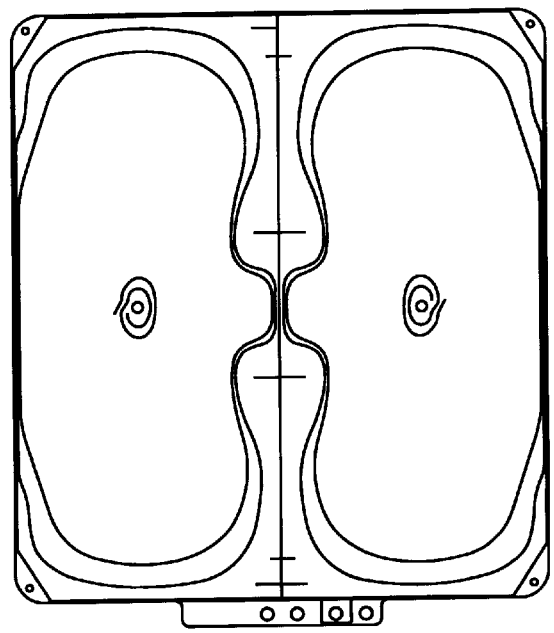
Figure 7:
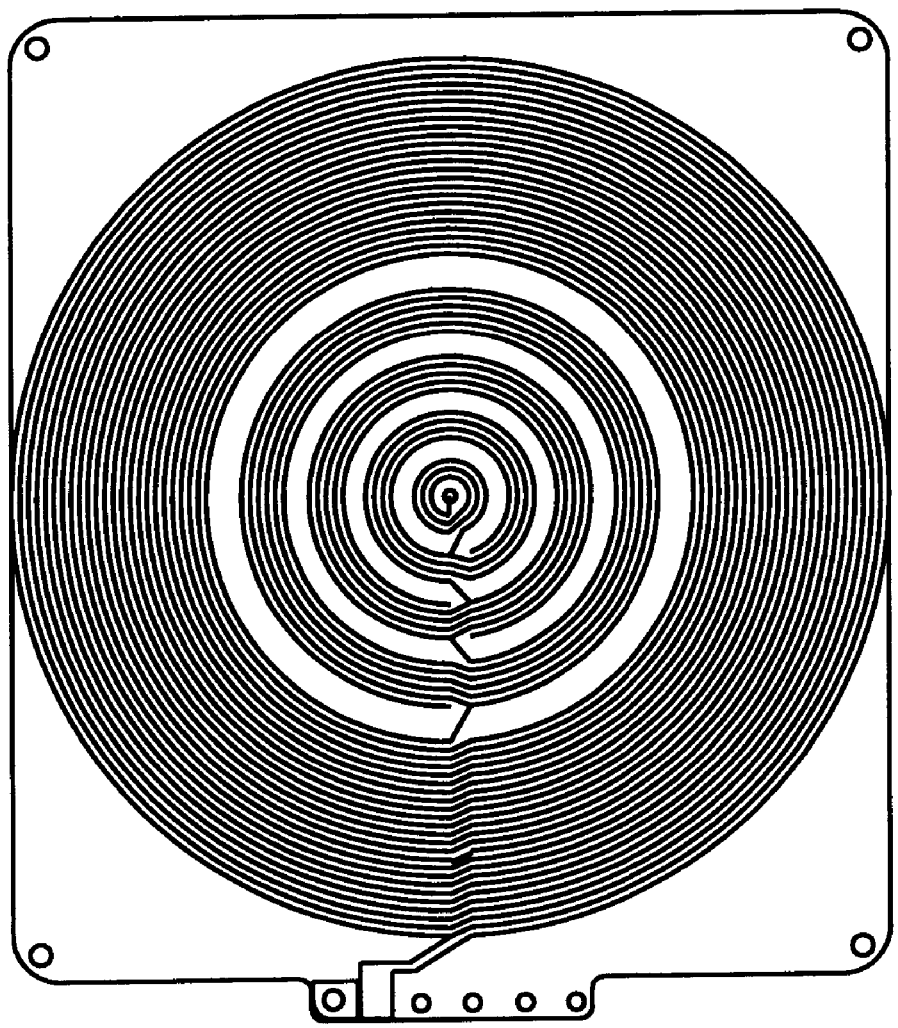

The design of the gradient coil printed circuit layout is well known in the art and is not the subject of the present invention. Reference is now briefly made to FIGS. 5, 6 and 7 which are front views schematically illustrating printed circuit layout designs for the x-gradient coil, y-gradient coil and z-gradient coil, respectively, useful in constructing the multi-layer printed circuit assemblies 52 and 54 of FIG. 4. It is noted that, the layout designs of FIGS. 5–7 are exemplary designs and that other designs can be used in implementing the multi-layer printed circuit assemblies of the present invention.

It in noted that, the printed circuits from which the multi-layer printed circuit assemblies 52 and 54 are assembled are scaled in size and the magnitude of the currents is adapted in such a way, that the gradient fields of appropriate level are built up within the imaging volume, without increasing the undesirable effects of the eddy currents on the main magnetic field and on the localized heating of the permanent magnets 2 and 4.

An advantage of placing the multi-layer printed circuit assemblies 52 and 54 outside the region 14, is the increase in available space in the region 14 which is used for accommodating the imaged or treated organ. For example, the multi-layer printed circuit assemblies 52 and 54 are sufficiently distanced from the magnet assemblies 2 and 4, respectively, to allow free space for the shoulders (not shown in FIG. 4) of a patient undergoing brain surgery.

The freeing of extra space in the region 14 also results in increase in the freedom and convenience of positioning and manipulating surgical instruments (not shown) or other equipment (not shown) within and around the imaged or treated organ.

The eddy currents generated by the z-gradient coil, are the most likely to interfere with the imaging process. The direction of the magnetic field generated by the z gradient coil is such that the eddy currents resulting from changes in the magnetic flux generated by the z-gradient create a spurious magnetic field along the z-axis. Therefore, it may be desirable to position the z-gradient coils in the region 14 between the magnet assemblies 2 and 4 while positioning the x-gradient coil, the y-gradient coil and the shim coil outside of the region 14.

Figure 8:
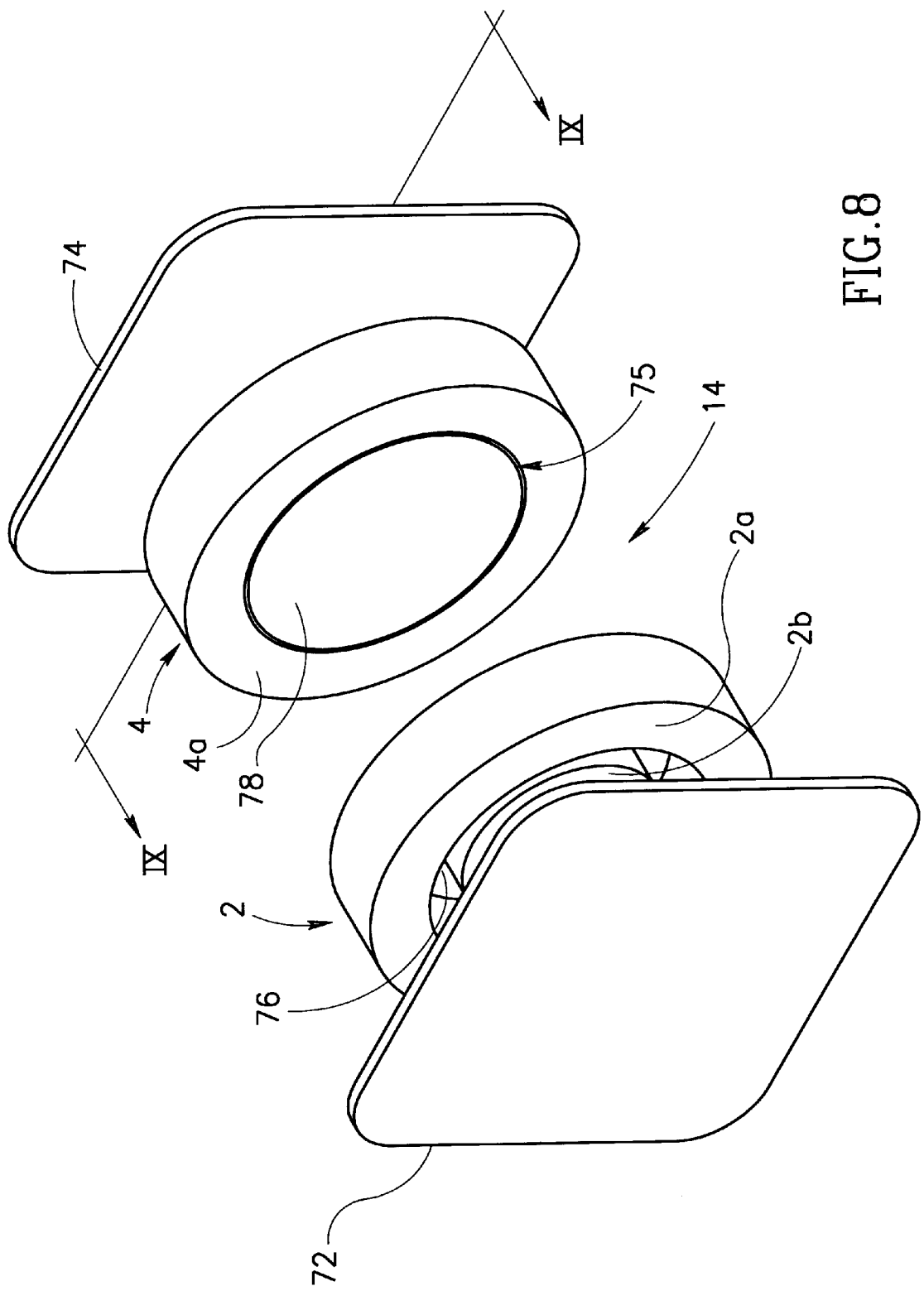
FIG. 8 is a schematic isometric view illustrating part of an MRI probe having the z-gradient coil positioned in the volume between the two permanent magnet assemblies and the x and y gradient coils positioned outside of the volume between the two permanent magnet assemblies, in accordance with yet another preferred embodiments of the present invention.

Reference is now male to FIG. 8 which is a schematic isometric view illustrating part of an MRI probe having the z-gradient coil positioned in the volume between the two permanent magnet assemblies and having the x-gradient, y-gradient and the shim coils positioned outside of the volume between the two permanent magnet assemblies, in accordance with yet another preferred embodiment of the present invention.

The part of the MRI probe illustrated in FIG. 8 includes the two permanent magnet assemblies 2 and 4 of FIG. 2, a pair of multi-layer printed circuit assemblies 72 and 74 positioned outside of the region 14 and a pair of multi-layer printed circuit assemblies 76 and 78 positioned in the region 14 between the magnet assemblies 2 and 4. Each of the printed circuit boards 76 and 78 includes the z-gradient coils (not shown) as disclosed hereinabove. Each of the multi-layer printed circuit assemblies 72 and 74 includes the x and y gradient coils and the shim coils (not shown).

Figure 9:
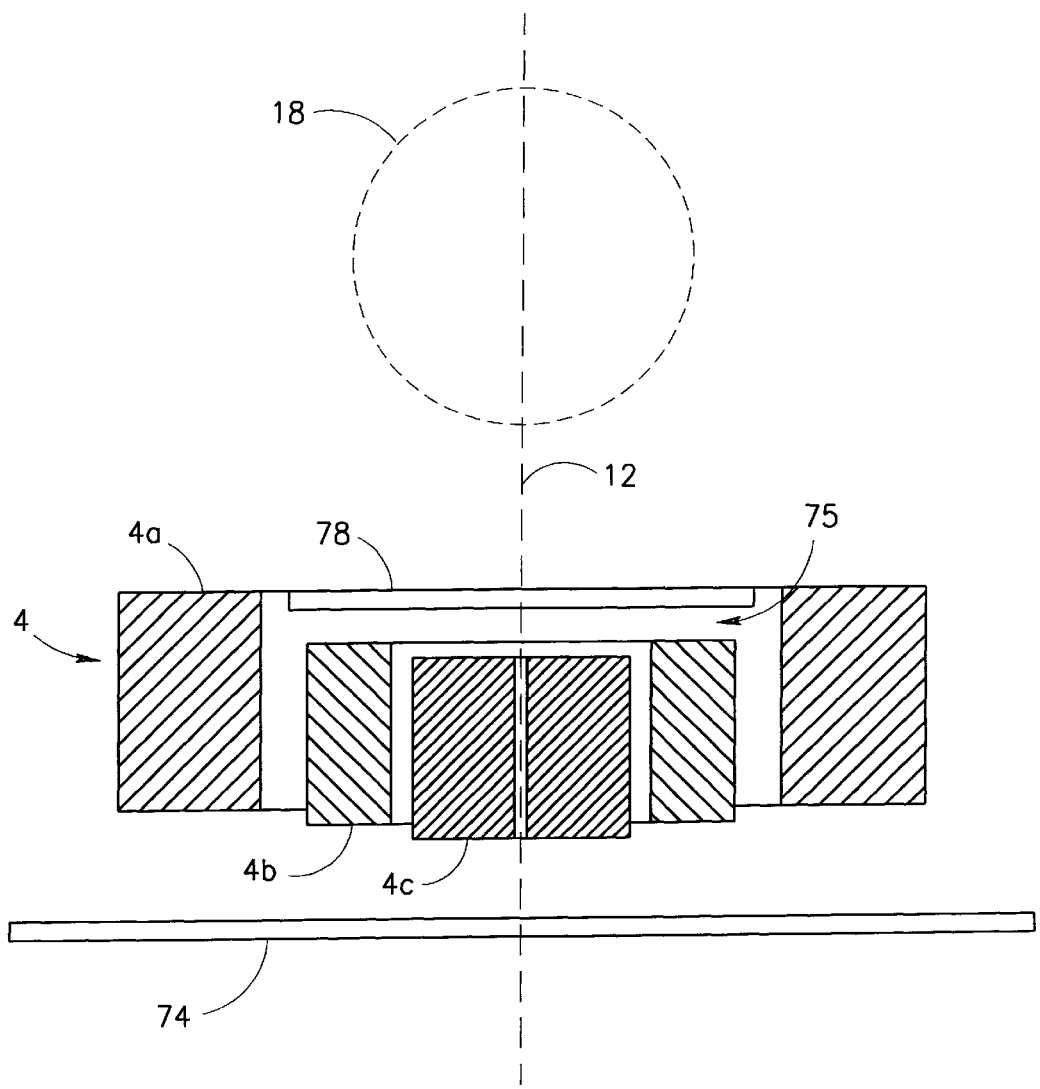
FIG. 9 is a cross section of the magnet assembly, printed circuit board and multi-layer printed circuit assembly of FIG. 8 taken along the lines IX—IX.

Reference is now made to FIG. 9 which is a cross section of the magnet assembly 4 the printed circuit board 78 and the multi-layer printed circuit assembly 74 of FIG. 8 taken along the lines X—X. The printed circuit board 78 is positioned within the recess 75 formed by the annular permanent magnets 4a and 4b which are offset along the axis 12. The printed circuit board 76 (best seen in FIG. 8) is similarly positioned within a recess (not shown) formed by the annular permanent magnets 2a and 2b (FIG. 8) which are also offset along the axis 12.

Thus, the printed circuit boards 76 and 78 do not occupy a significant portion of the space in the region 14 between the magnet assemblies 2 and 4.

The arrangement of the x, y and z gradient coils illustrated in FIGS. 8 and 9 has the advantage that the z-gradient is generated close to the imaging volume 18 (best seen in FIGS. 2 and 9). Thus, the superimposed z-gradient field is minimally affected by the spurious eddy currents, while keeping the region 14 minimally obstructed by positioning the x and y-gradient coils outside of the region 14.

Figure 10:
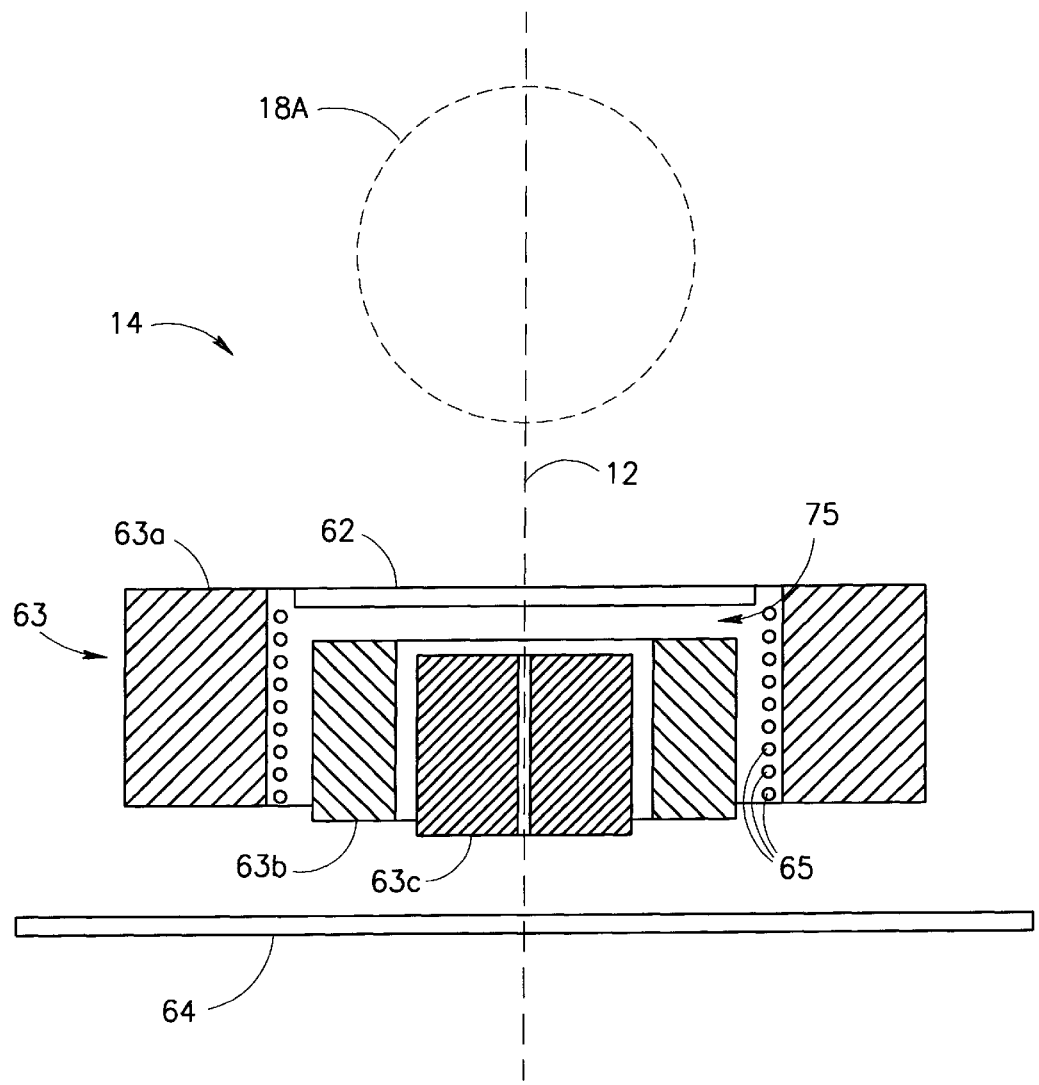
FIG. 10 is a cross section illustrating part of an MRI probe having z-gradient coils positioned between two annular permanent magnets, in accordance with another preferred embodiment of the present invention.

Reference is now made to FIG. 10 which is a cross section illustrating part of an MRI probe having z-gradient coils positioned between two annular permanent magnets, in accordance with another preferred embodiment of the present invention.

The magnet assembly 63 includes the annular permanent magnets 63a, 63b and 63c. In contrast to the MRI probe of FIG. 8 in which the z-gradient coils are substantially planar coils included in the multi-layer printed circuit assemblies 72 and 74, the z-gradient coil 65 of FIG. 10 is positioned between the annular permanent magnets 63a and 63b and extends in a direction parallel to the axis 12. The multi-layer printed circuit assembly 64 includes x-gradient and y-gradient coils (not shown) and the shim coil (not shown). The multi-layer printed circuit assembly 62 may also include the RF coils (not shown).

It is noted that, the z-gradient coil 65 may be shaped as a helical coil with a circular cross section or as an extended coil having another suitable cross section such as a regular polygonal cross section.

It is further noted that, while the z-gradient coil 65 of FIG. 10 is shown as an even-pitched helical coil for the sake of clarity of illustration, the z-gradient coil 65 may have a variable pitch such that the number of coil windings per unit length may vary along the coil as is well known in the art.

It will be appreciated by those skilled in the art, that many variations having different positioning of the gradient coils and the shim coils are possible which are within the scope of the present invention. For example, in all the preferred embodiments of FIGS. 4, 8, 9 and 10, the shim coils may be positioned in the region 14 between the magnet assemblies 2 and 4 (FIGS. 4, 8 and 9), or between the magnet assembly 63 (FIG. 10) and the complementary magnet assembly (not shown in FIG. 10).

It is noted that, in all the embodiments of the present invention, the RF coils are positioned in the region 14 between the pairs of permanent magnet assemblies. However, in other preferred embodiments of the present invention, the receiving RF coil (not shown) can be internally positioned within the region 14 while a portion of the transmitting RF coil (not shown) is positioned outside the region 14.

Returning to FIG. 3, the structure 32 serving as the magnetic flux returning circuit encases the segments 34 of the permanent magnets 36 and 38. If the glue between any of the segments 34 becomes loose, the attractive force between the segments 34 of the permanent magnets 36 and 38 will tend to pull the loose segments towards each other and into the region where the organ of the patient 44 is positioned. However, the structure 32 encases the segments 34 and prevents any loose segments 34 from moving towards the organ of the patient 44.

Turning briefly to FIGS. 2 and 4, If any of the segments 24 of the magnet assemblies 2 and 4 become loose or fractured, the loose segments or loose fragments thereof may fly into the region 16 (FIG. 2) or region 14 (FIG. 4) because of the attractive forces between the segments of the magnet assemblies 2 and 4.

Figure 11:
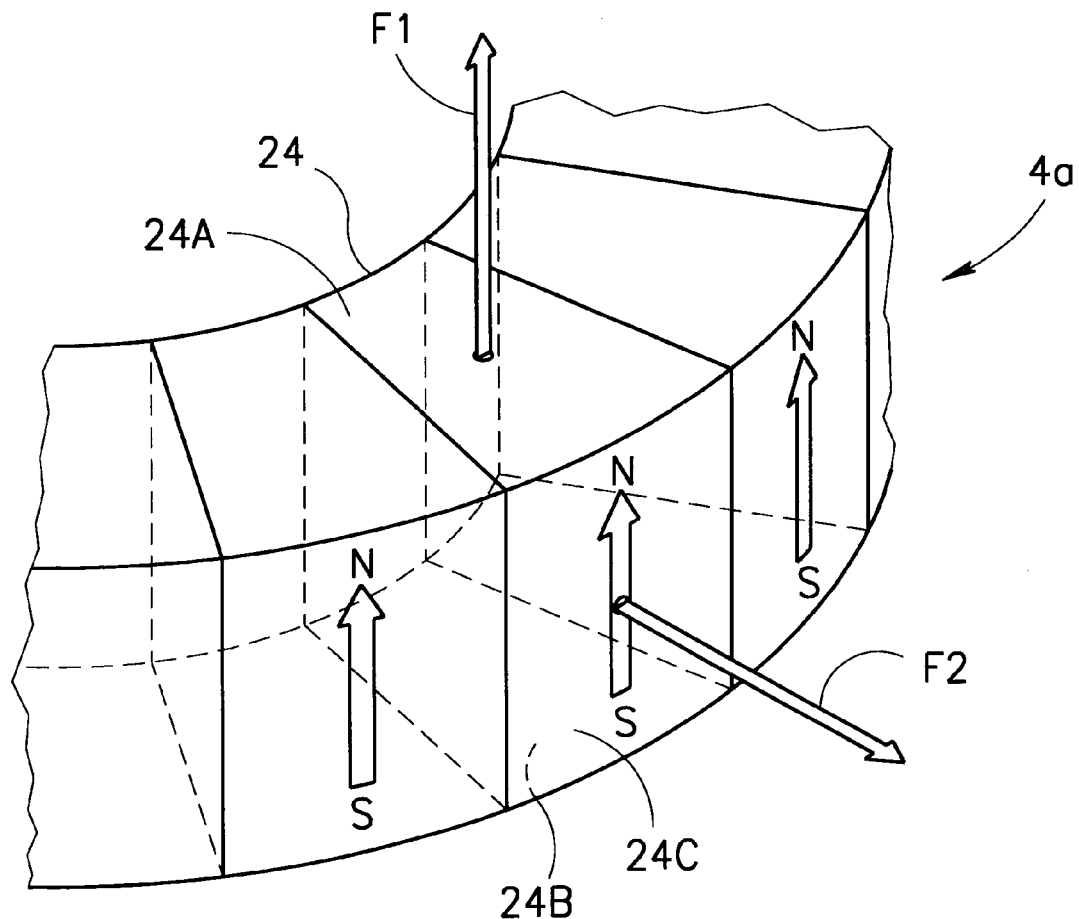
FIG. 11 is an isometric view of part of the annular permanent magnet of FIG. 2 useful in understanding the forces acting on a segment of the annular permanent magnet.

Reference is now made to FIG. 11 which is an isometric view of part of The annular permanent magnet 4a of FIG. 2 illustrating the forces acting on a segment of the annular permanent magnet 4a.

Each of the segments 24 of the permanent annular magnet 4a has a planar surface 24A facing towards the magnet assembly 2 (not shown), a planar surface 24B parallel to the surface 24A and facing away from the magnet assembly 2, and a curved surface 24C. Each of the segments 24 of the permanent annular magnet 4a is subjected to a force F1 which is normal to the surface 24A. The force F1 is due to magnetic attraction between the segment 24 and the magnet assembly 2 (FIG. 2). Each of the segments 24 of the permanent annular magnet 4a is also subjected to a force F2 which is normal to the plane tangential to the surface 24C. The force F2 is the vector sum of the repulsive forces (not shown) between the segment 24 and all the other segments 24 of the annular permanent magnet 4a. These repulsive forces arise due to the fact that all of the segments 24 included within the annular permanent magnet 4a have their magnetic axes aligned parallel to each other. The direction and polarity of the magnetic field of each of the segments 24 is indicated by the stippled arrows labeled S and N indicating the south and north poles, respectively, of each of the segments 24.

If the glue attaching any of the segments 24 fails or if any of the segments fractures, the segments or the fragments thereof may fly in a direction of the vector sum of the forces F1, F2 and any additional forces (not shown) acting on the segments or on the fragments thereof.

Figure 12:
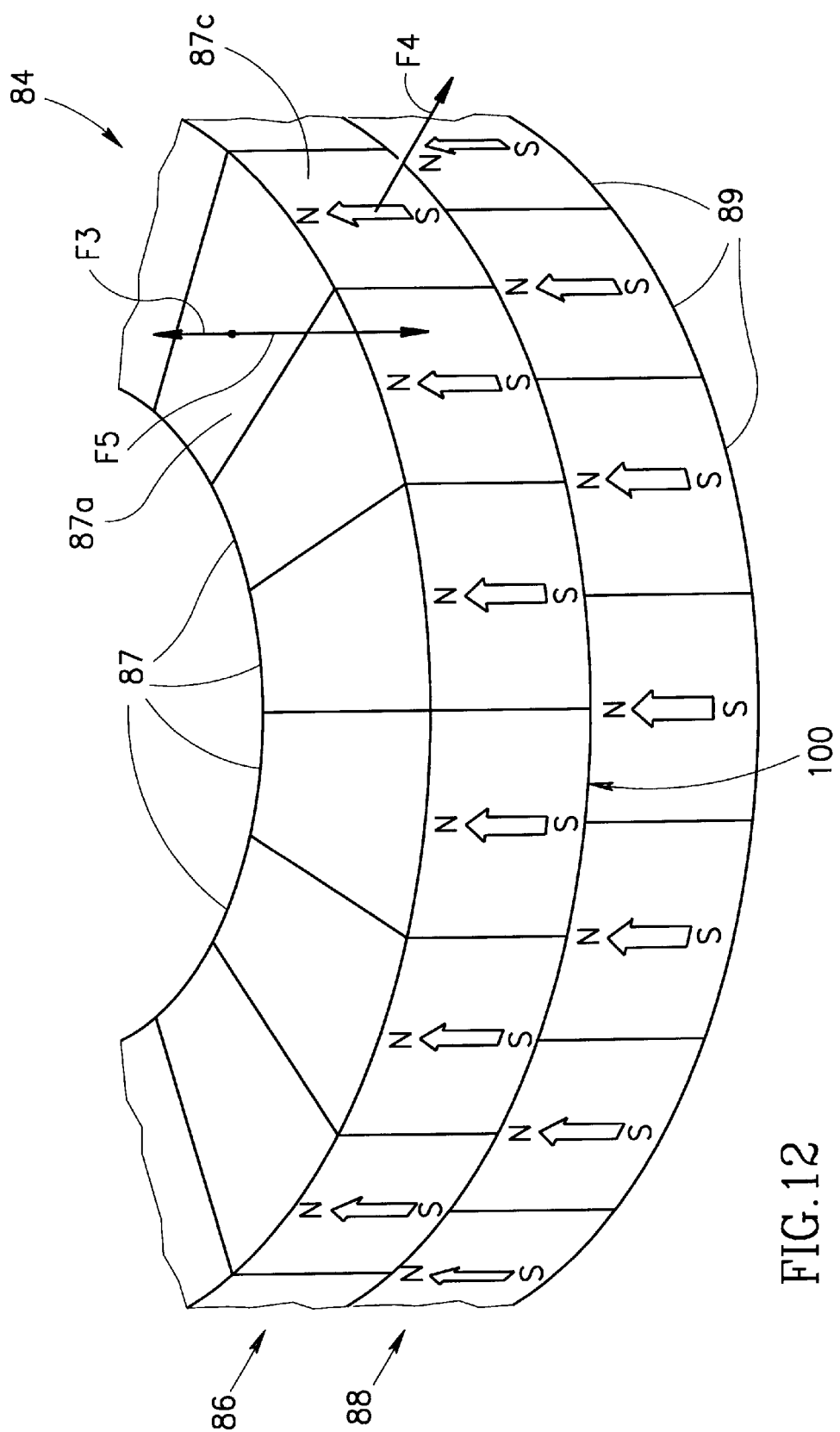
FIG. 12 is an isometric view illustrating part of an annular permanent magnet including two layers of segments, in accordance with another preferred embodiment of the present invention.

Reference is now made to FIG. 12 which is an isometric view illustrating part of an annular permanent magnet including two layers of segments, in accordance with another preferred embodiment of the present invention.

The annular permanent magnet 84 includes two layers 86 and 88. The layer 86 includes a plurality of segments labeled 87 and the layer 88 includes a plurality of segments labeled 89. The segments 87 of the layer 86 are attached to each other by an electrically non-conducting glue (not shown) or by electrically non-conducting spacers (not shown). The segments 89 of the layer 88 are also attached to each other by an electrically non-conducting glue (not shown) or by electrically non-conducting spacers (not shown). The layers 86 and 88 are attached to each other by an electrically non-conducting glue (not shown) or by a an electrically non-conducting spacer or spacers (not shown). Preferably, the shape and dimensions of the layers 86 and 88 are identical and the shape and dimensions of each of the segments 87 and 89 are identical. The layers 86 and 88 are attached to each other such that the segments 87 are symmetrically staggered with respect to the segments 89. The alignment of the layer 86 relative to layer 88 is such that each of the segments 87 is offset from the underlying segment 89 by a distance equivalent to half the arc subtended by the segment 87 along the circumference of the circle 100. The direction and polarity of the magnetic field of each of the segments 87 and 89 is indicated by the stippled arrows labeled S and N as disclosed hereinabove. The annular permanent magnet 84 is part of a magnet assembly (not shown) which is aligned with another similarly constructed magnet assembly (not shown for the sake of clarity of illustration), this alignment is similar to the alignment of the magnets assemblies 2 and 4 of FIGS. 2 and 4 with respect to the alignment axis and the polarity of the magnetic fields of the magnet assemblies 2 and 4.

Each of the segments 87 is subjected to a force F3 which is normal to the surface 87a. The force F3 is due to the magnetic attraction between the segment 87 and the magnet assembly (not shown) aligned opposite to the magnet assembly including the annular permanent magnet 84. Each of the segments 87 of the permanent annular magnet 84 is also subjected to a force F4 which is normal to the plane tangential to the surface 87c. The force F4 is the vector sum of the repulsive forces (not shown) between the segment 87 and all the other segments 87 of the annular permanent magnet 84. These repulsive forces arise due to the fact that all of the segments 87 included within the annular permanent magnet 84 act as magnetic dipoles aligned parallel to each other and having the same south-north orientation.

However, in contrast to the segments 24 of FIG. 11, each of the segments 87 is subjected to a force F5 which is normal to the surface 87a and opposite in direction to the force F3. The force F5 is due to the magnetic attraction between the segment 87 and the underlying segments 89 of the layer 88.

The force F5 is much larger than the vector sum of the forces F3 and F4.

Each of the segments 89 is subjected to a set of forces similar to the set of forces acting on the segments 87, except that the magnitude of the force (not shown) attracting the segment 89 towards the opposing magnet assembly (not shown) is smaller then F3 due to the greater distance between the segments 89 and the opposing magnet assembly, and the force (not shown) attracting the segment 89 to the segments 87 is equal in magnitude but opposite in direction to the force F5.

Thus, if the glue holding any of the segments 87 and 89 loosens or any of the segments fracture, the two layers 86 and 88 including all the segments or possible fragments thereof are attracted to each other by a net attractive force which will prevent the loose segments or fragments from flying or falling. This net attractive force holds any loose segment or fragment attached in its place.

An advantage of the staggered double layer structure of the annular permanent magnet of FIG. 12 is the increased safety for the patient whose organ is imaged or treated in the MRI probe of the present invention.

An additional benefit of the staggered double layer structure of FIG. 12 is the improved homogeneity of the magnetic field generated by the annular permanent magnet. This improved homogeneity results from the fact that the thin layers (not shown) of electrically non-conducting glue or spacer between the segments 24 of FIG. 11 cause local reductions in the magnetic field intensity since they are made from non-magnetic material. The staggered double layer structure of the annular permanent magnet 84 illustrated in FIG. 12 reduces the magnitude of these local reductions by approximately 50% relative to the local reductions of the single layer annular permanent magnet 4a of FIG. 11, for annular permanent magnets 4a and 84 having the same dimensions.

This reduction occurs because the height of the non-magnetic glue or spacer material present within the annular permanent magnet 84 along the direction of the magnetic field is reduced by half because of the staggering of the segments 87 and 89 disclosed hereinabove.

It is noted that, the layer arrangement within the annular permanent magnets of the present invention is not limited to two layers and that multiple layer arrangements are also possible.

Figure 13:
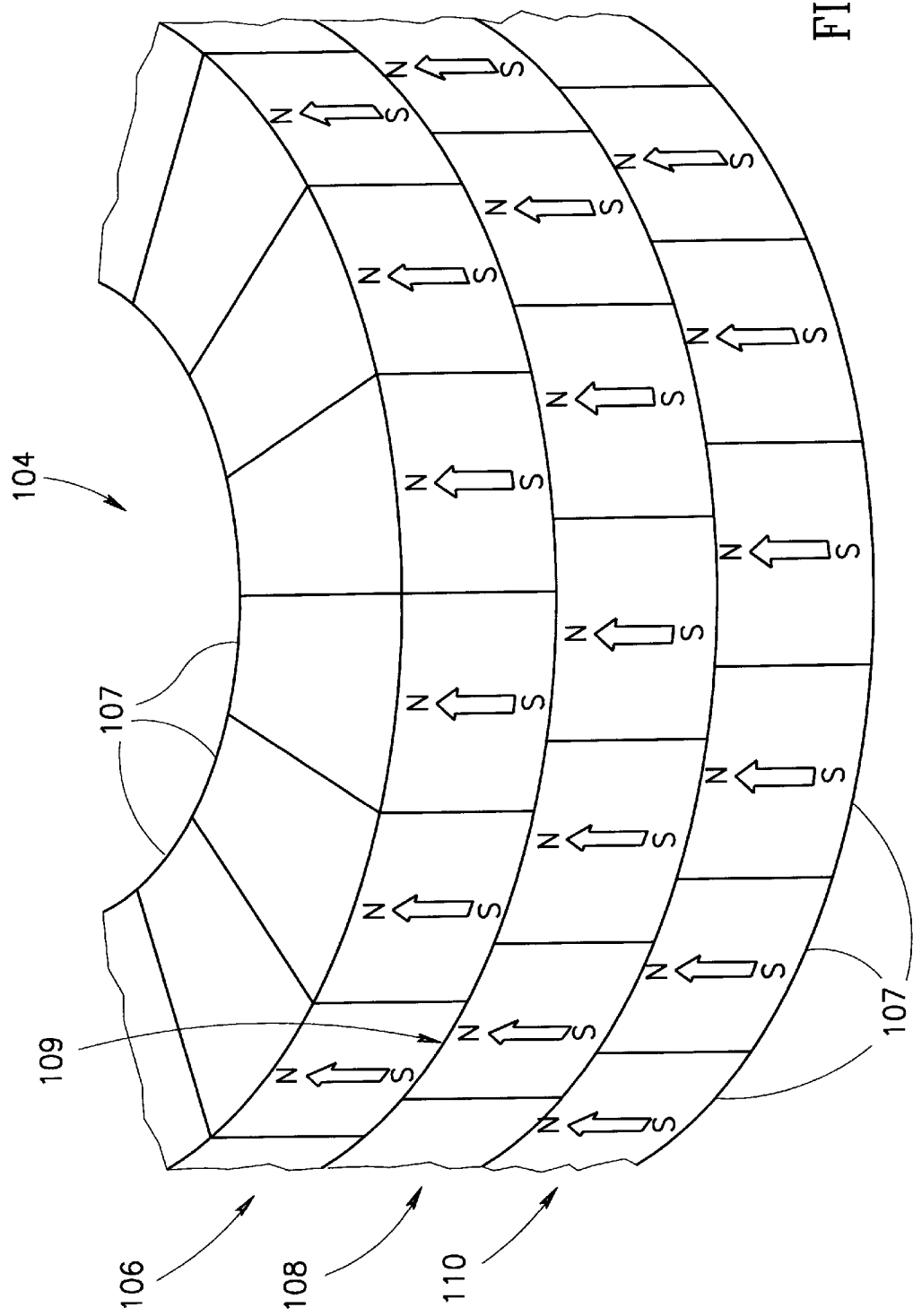
FIG. 13 is an isometric view illustrating part of an annular permanent magnet including multiple layers having segments, in accordance with yet another preferred embodiment of the present invention.

Reference is now made to FIG. 13 which is an isometric view illustrating part of an annular permanent magnet including multiple layers of segments, in accordance with yet another preferred embodiment of the present invention.

The annular permanent magnet 104 includes three layers 106, 108 and 110. Preferably, the layers 106, 108 and 110 are identical in size and shape and include segments 107 which are preferably identical in size. The segments 107 of each of the layers 106, 108 and 110 are attached to each other with electrically non-conducting glue or electrically non-conducting spacers (not Shown) and the layers 106, 108 and 110 are also attached to each other with electrically non-conducting glue or electrically non-conducting spacers (not Shown) as disclosed hereinabove. The segments 107 of the layer 106 are staggered with respect to the segments 107 of the layer 108 such that each of the segments 107 of the layer 106 is offset from the underlying segment 107 of the layer 108 by a distance equivalent to a third of the arc subtended by the segment 107 along the circumference of the circle 109. The segments 107 of the layer 108 are staggered with respect to the segments 107 of the underlying layer 110 such that each of the segments 107 of the layer 108 is offset from the underlying segment 107 of the layer 110 by a distance equivalent to a third of the arc subtended by the segment 107 along the circumference of the circle 109.

The direction and polarity of the magnetic field of each of the segments 107 is indicated by the stippled arrows labeled S and N as disclosed hereinabove.

This arrangement, even further reduces the inhomogeneity of the magnetic field generated by the annular permanent magnet 104, while still having a net force attracting the segments 107 to each other as disclosed hereinabove.

It is noted that, the annular permanent magnet of the present invention may be constructed from another number of staggered layer of segments greater than three. However, there may be a practical limit to the number of layers implemented due to the increasing difficulty of assembling, aligning and gluing of a large number of segments.

It is further noted that while the preferred embodiments of FIGS. 12 and 13 illustrate annular permanent magnets having layers of identical height along the direction of the magnetic field, other implementations are possible using various combinations of layers having different heights.

It is still further noted that, while the preferred embodiments of FIGS. 12 and 13 show the detailed structure of only one of the annular permanent magnets 84 and 104 which are part of magnet assemblies (not shown) containing multiple concentric annular permanent magnets, the other annular permanent magnets included in the magnet assemblies are preferably also structured from multiple staggered layers as disclosed hereinabove. Moreover, the number of layers and the type of staggering for each of the annular permanent magnets composing a single magnet assembly may be selected according to the desired magnetic field properties and manufacturing considerations.

U.S. Pat. No. 5,900,793 to Katznelson et al. disclosed hereinabove teaches a method of improving the homogeneity of the magnetic field between opposing annular permanent magnets used in an MRI probe. The method includes selecting segments from a batch of equi-angular segments so that the variations in a magnetic field strength of adjacent segments follow a cyclic curve having a regular period, and combining the segments to form an annular permanent magnet. A magnet assembly is formed by connecting two or more such annular permanent magnets by a low magnetic permeability material. Finally two such magnet assemblies are aligned such that for each pair of opposing annular permanent magnets, the cyclic curves representing the magnetic field variation are aligned in anti-phase. The method improves the homogeneity of the achievable permanent magnetic field.

In accordance with yet another preferred embodiment of the present invention, the method disclosed by Katznelson et al. in U.S. Pat. No. 5,900,793 can be similarly applied in constructing annular permanent magnets used in the MRI probes of the present invention.

Figure 14:
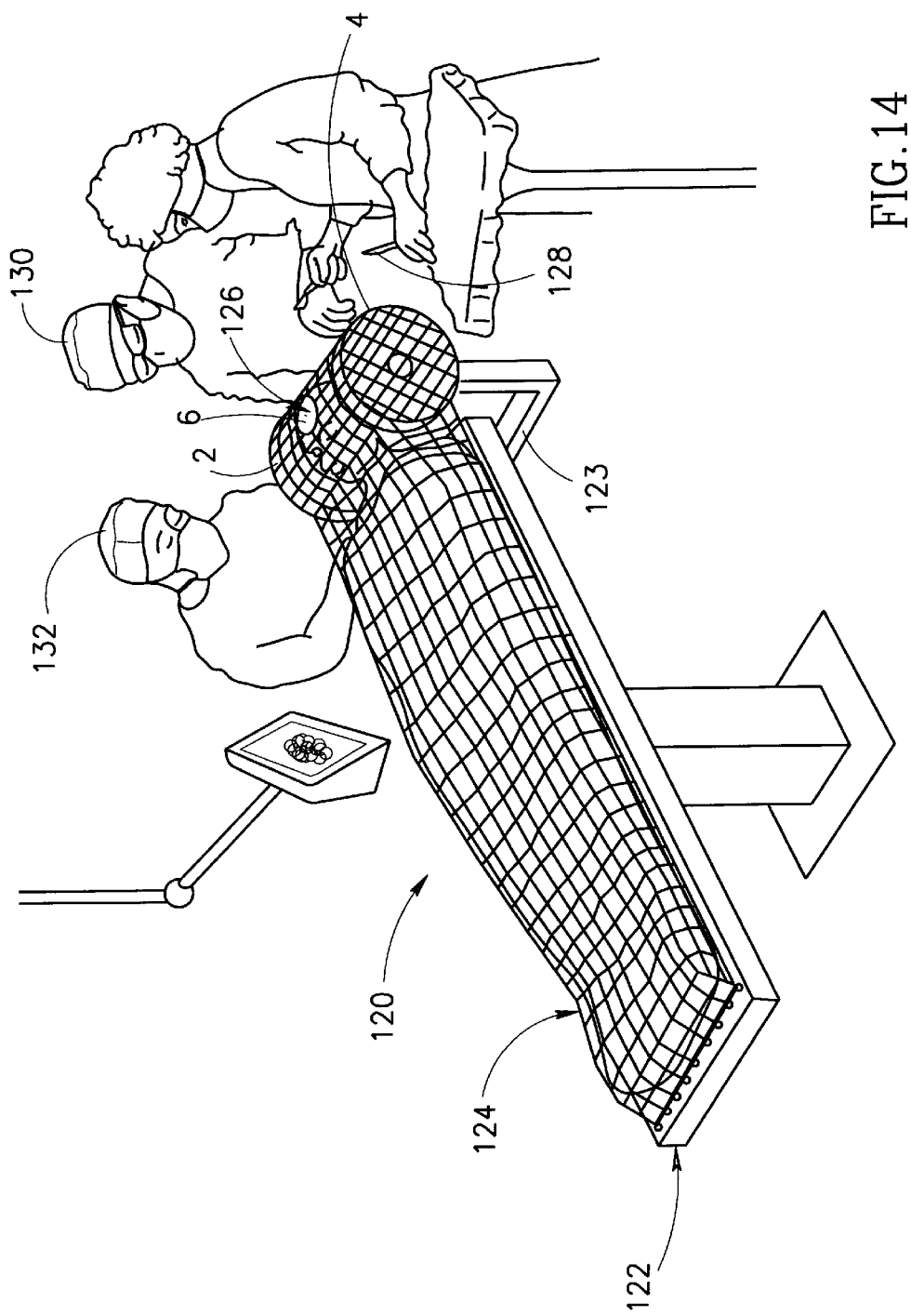
FIG. 14 is a pictorial illustration of a small organ dedicated MRI probe used in conjunction with a local disposable RF cage, in accordance with a preferred embodiment of the present invention.

Reference is now made to FIG. 14 which is a pictorial illustration of a small organ dedicated MRI probe used in conjunction with a local disposable RF cage, in accordance with a preferred embodiment of the present invention.

Figure 1:
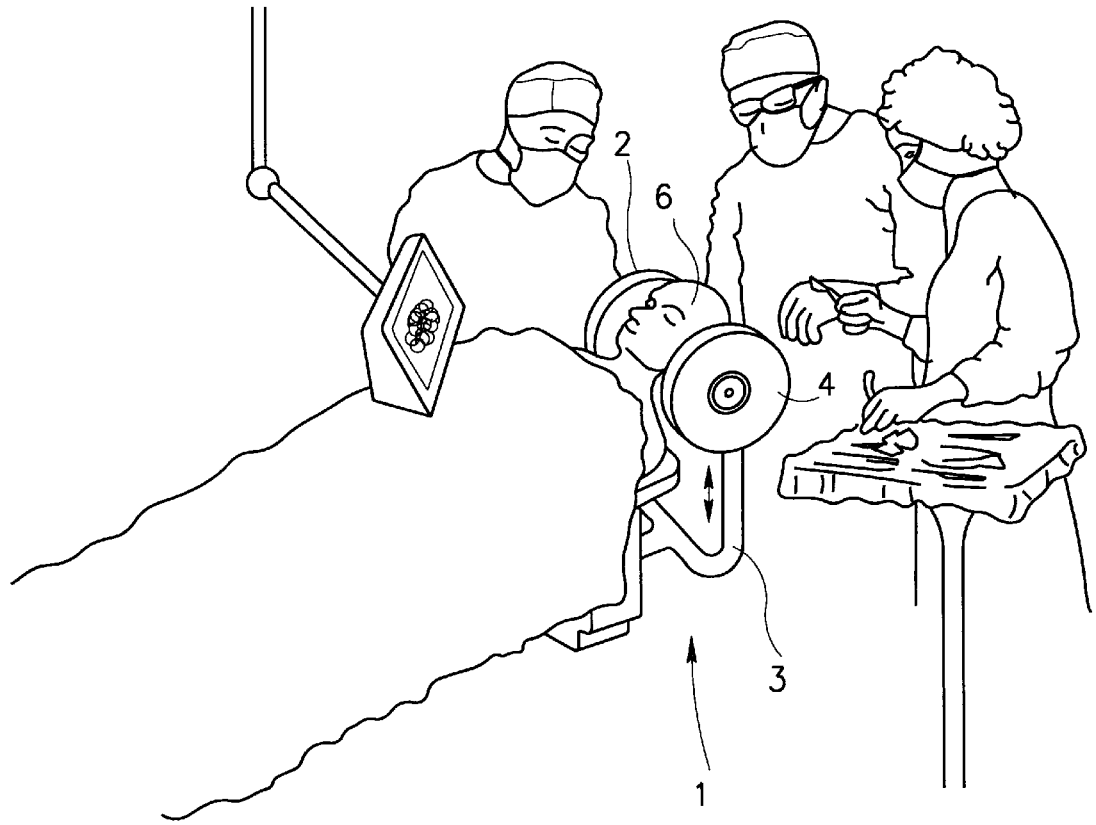
FIG. 1 is a schematic perspective view of a small organ dedicated MRI probe useful in brain surgery.

The small organ dedicated MRI probe 120 includes the magnet assemblies 2 and 4 of FIG. 1 which are attached to a surgical table 122 by an adjustable frame 123. The surgical table is made from a conductive material such as stainless steel. The probe 120 also include an RF cage 124. The RF cage 124 is made of a sheet of flexible conductive RF mesh having a size and shape suitable for covering the body of the patient 6 and the magnet assemblies 2 and 4.

The RF cage 124 is electrically connected to the surgical table 122 for completing the shielding of the MRI probe 120. The RF cage 124 may be suitably grounded. The RF cage 124 also has an opening 126 therein. The opening 126 is used by the surgeons 130 and 132 for accessing the brain of the patient 6 during surgery. For example, a surgical instrument 128 can be inserted through the opening 126 into the brain of the patient 6. The size and shape of the opening 126 is designed to enable comfortable insertion and manipulation of surgical instruments therethrough, while still enabling effective shielding of the MRI probe creating a "self shielded" magnet.

The RF cage 124 can also be made from a conductive flexible RF mesh made of a conductive material such as copper metal embedded in a flexible sheet of art electrically non-conductive material such as a suitable plastic. The RF cage 124 can also be made from a thin flexible sheet of conductive material such as metal foil.

It is noted that, the materials from which the RF cage is made must be sterilizable and the RF cage 124 is disposable.

It is further noted that, the method of placing some or all of the gradient coils outside of the region containing the imaging volume may enable further increasing of the available space between the permanent magnet assemblies of the present invention by properly configuring and positioning of the RF coil.

Figure 15:
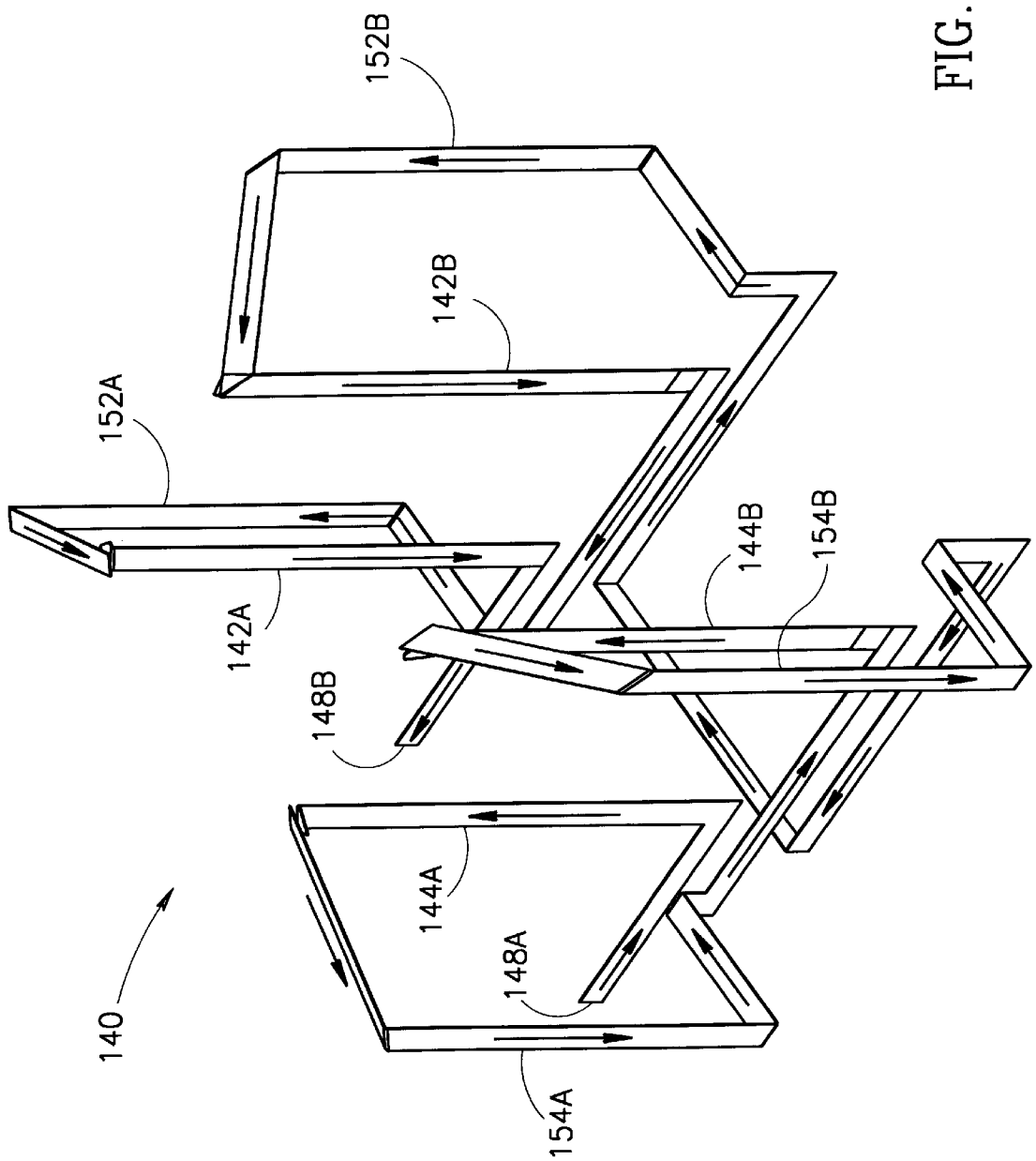
FIG. 15 is a schematic isometric view illustrating a transmitting RF coil providing linear polarization useful with the MRI probes of the present invention.

Reference is now made to FIG. 15 which is a schematic isometric view illustrating a transmitting RF coil providing linear polarization useful with the MRI probes of the present invention.

The transmitting RF coil 140 is preferably made of a folded flat copper ribbon conductor but can be made of any other suitably shaped electrically conducting material capable of carrying the required electrical currents. The coil 140 includes four front conductor portions 142A, 142B, 144A and 144B. When the RF coil 140 is electrically energized, an electrical current flows therethrough in the direction indicated by the arrows. The four front conductors 142A, 142B, 144A and 144B effectively form an open Helmholz coil configuration suitable for generating a linearly polarized RF electromagnetic field.

The coil 140 also includes four current return conductor portions 152A, 152B, 154A and 154B.

The coil terminals 148A and 148B are electrically connected to a suitable RF amplifier (not shown) for energizing the coil 140.

Figure 16:
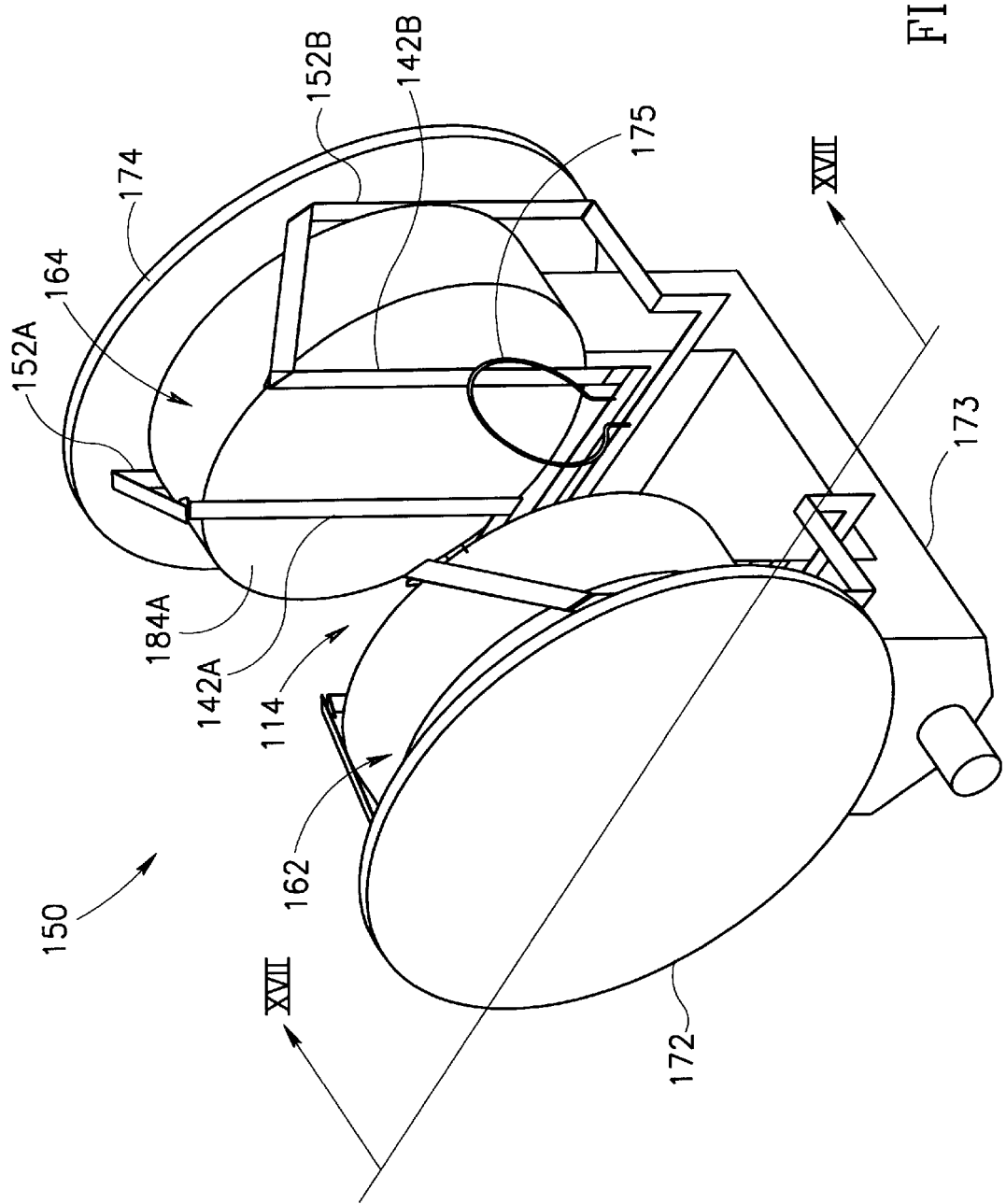
FIG. 16 is a schematic isometric view illustrating an MRI probe including the transmitting RF coil of FIG. 15 disposed therein, in accordance with a preferred embodiment of the present invention.
Figure 17:
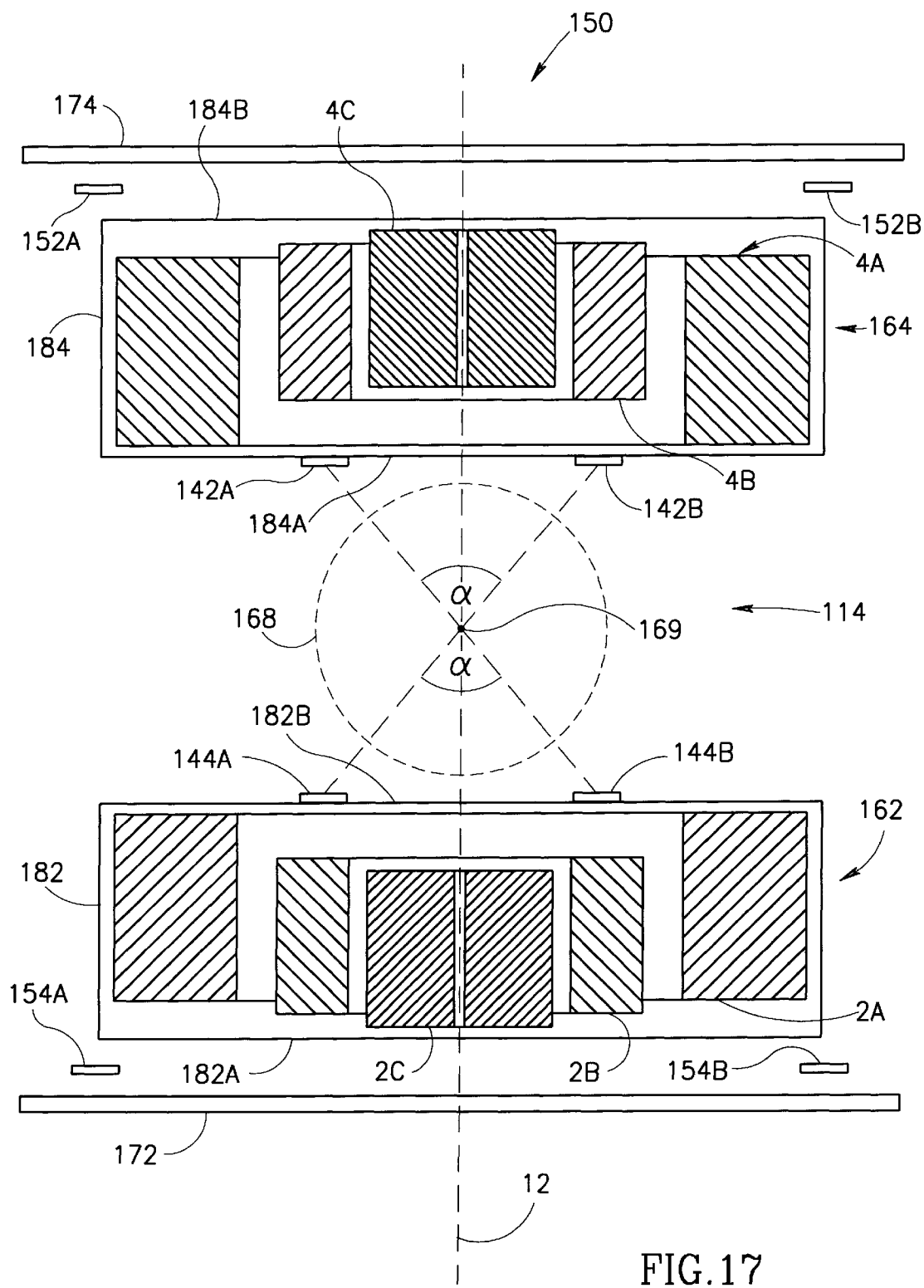
FIG. 17 is a schematic cross section of the MRI probe of FIG. 16 taken along the lines XVII—XVII.

Reference is now made to FIGS. 16 and 17. FIG. 16 is a schematic isometric view illustrating an MRI probe 150 including the transmitting RF coil 140 of FIG. 15 disposed therein, in accordance with a preferred embodiment of the present invention. FIG. 17 is a schematic cross section of the MRI probe 150 of FIG. 16 taken along the lines XVII—XVII.

The MRI probe 150 includes two permanent magnet assemblies 162 and 164. The permanent magnet assembly 162 includes a housing 182 and a set of three concentric annular permanent magnets 2A, 2B and 2C attached to the housing 182. The permanent magnet assembly 164 includes a housing 184 and a set of concentric annular permanent magnets 4A, 4B and 4C attached to the housing 184. The housings 182 and 184 are made of fiberglass or from any other suitable electrically non-conducting plastic material or the like. The details of the structure, construction and tuning of the annular permanent magnets included within the permanent magnet assemblies 162 and 164 are not the subject matter of the present invention and will therefore not be discussed in detail herein. The structure and design of such permanent magnet assemblies is disclosed in co-pending U.S. Pat. No. 5,900,793 to Katznelson et al.

The permanent magnet assembly 162 includes a first surface 182A and a second surface 182B. The permanent magnet assembly 164 includes a third surface 184A and a fourth surface 184B. The two permanent magnet assemblies 162 and 164 are attached to a frame 173 and oppose each other such that the second surface 182B and the third surface 184A define therebetween an open region of space 114. The permanent magnet assemblies 162 and 164 produce a region of substantially homogenous magnetic field 168 disposed within the region 114.

The probe 150 also includes multi-layer printed circuit assemblies 172 and 174. The printed circuit assemblies 172 and 174 each include planar printed circuits boards (not shown) comprising an X-gradient coil, a Y-gradient coil, a Z-gradient coil and shim coils as disclosed in detail hereinabove for the multi-layer printed circuit assemblies 52 and 54 the MRI probe of FIG. 4. The printed circuit assembly 172 is disposed outside of the region 114 and faces the first surface 182A of the permanent magnet assembly 162. The printed circuit assembly 174 is also disposed outside of the region 114 and faces the fourth surface 184B of the permanent magnet assembly 164.

The MRI probe 150 further includes a transmitting RF coil 140 for producing an RF electromagnetic field within the open region 114, and a receiving RF coil 175 positioned within the open region 114, adjacent to the organ or body part (not Shown) which is to be imaged, for receiving RF electromagnetic signals from the organ or body part.

It is noted that the receiving RF coil 175 can be any suitable type of receiving RF coil known in the art, such as a flexible RF coil (not shown) or other types of RF coils having suitable dimensions for positioning near the organ or body part which is being imaged. Furthermore, in accordance with another embodiment of the present invention the MRI probe 150 may also include a plurality of small receiving RF coils (not shown) which may be disposed at different positions adjacent the organ or body part (not shown) as is well known in the art.

The part of the transmitting RF coil 140 which includes the four front conductor portions 142A, 142B, 144A and 144B is disposed in the open region 114 between the permanent magnet assemblies 162 and 164.

The front conductor portions 144A and 144B are positioned adjacent to the surface 182B and are glued or attached thereto. Similarly, the front conductor portions 142A and 142B are positioned adjacent to the surface 184A and are glued or attached thereto. However, the front conductor portions 144A, 144B and 142A, 142B may also be positioned adjacent to the surfaces 182B and 184A, respectively, without being attached thereto.

Preferably, in accordance with a design for an open Helmholz coil the distance between the front conductor portions 144A and 144B and the distance between the front conductor portions 142A and 142B is designed such that $\alpha=60°$, wherein $\alpha$ is the angle between the lines connecting the center point 169 of the imaging volume 168 with the centers of the front conductor portions 142A and 142B. The point 169 lies on the axis 12 and is the midpoint between the surfaces 182B and 184A. However, the angle $\alpha$ may also be different than 60° depending, inter alia, on the particular design parameters of the transmitting RF coil.

The part of the transmitting RF coil 140 which includes the four current return conductor portions 152A, 152B, 154A and 154B is disposed outside of the open region 114. The current return conductor portions 152A and 152B are disposed between the surface 184B and the multi-layer printed circuit assembly 174, and the current return conductor portions 154A and 154B are disposed between the surface 182A, and the multi-layer printed circuit assembly 172.

An advantage of the above design of the transmitting RF coil 140 is that The current return conductor portions 152A, 152B, 154A and 154B which do not contribute to the RF field and may actually cause a reduction thereof can be distanced from the corresponding front conductor portions 142A, 142B, 144A and 144B to diminish the RF field reduction by the current return conductor portions 152A, 152B, 154A and 154B.

An additional advantage of disposing the current return conductor portions 152A, 152B, 154A and 154B outside the region 114 is the increase in the space available within the open region 114 for positioning and manipulating an organ to be imaged or surgical instruments during medical interventional procedures.

It is noted that, the positioning of the multi-layer printed circuit assemblies 174 and 172 outside the region 114 and away from the front conductor portions 142A, 142B 144A and 144B, significantly reduces the loading of the transmitting RF coil 140 by the X, Y and Z coils (not shown) and the shim coils (not shown) which are disposed within the multi-layer printed circuit assemblies 174 and 172. The annular permanent magnets 2A, 2B, 2C, 4A, 4B and 4C have a lower electrical conductivity than the copper conductors of the X,Y,Z coils and the shim coils, because they are made of a material, such as an iron-neodimium-boron alloy, having electrical conductivity lower than copper and because of the construction of each of the annular permanent magnets 2A, 2B, 2C, 4A, 4B and 4C from a plurality segments which are electrically isolated from each other by an electrically non-conducting glue as disclosed in detail in co-pending U.S. Pat. No. 5,900,793 to Katznelson et al. Thus, the loading of the transmitting RF coil 140 and of the receiving RF coil 175 is significantly reduced by the placement of the multi-layer printed circuit assemblies 174 and 172 outside the region 114 and away from transmitting RF coil 140 and the receiving RF coil 175. The reduction in loading of the transmitting RF coil 140 enables achieving a desired transmitted signal quality without having to use expensive high-power RF transmitting Amplifiers. The reduction in loading of the receiving RF coil 175 enables achieving a significant improvement in the image quality obtained by the MRI probe 150.

It will be appreciated by those skilled in the art that, although the current return conductor portions 152A, 152B and 154A, 154B are being positioned closer to the multi-layer printed circuit assemblies 174 and 172, respectively, by being disposed outside of the open region 114, thus, potentially increasing the loading of the RF coil 140 by the gradient coils and shim coils, the multi-layer printed circuit assemblies 174 and 172 can be sufficiently distanced from the current return conductor portions 152A, 152B and 154A, 154B, respectively, by moving the multi-layer printed circuit assemblies 174 and 172 along the axis 12 away from the point 169 to reduce the loading of the RF coil 140.

The design of the MRI probe 150 can be thus optimized to give a desired high image quality by reducing the loading of the RF coil 140 without having to excessively increase the distance of the multi-layer printed circuit assemblies 174 and 172 from the point 169 of the imaging volume 168 which will require the use of stronger and more expensive amplifiers to energize the gradient and shim coils.

It is noted that, in prior art large MRI devices such as whole body imaging MRI devices, the gradient coils and the transmitting RF coils are internally disposed in the region between the magnets. Typically, this region is large enough to allow designing a sufficient distance between the transmitting RF coil and the gradient coils, thus solving the problem of reducing the loading the RF coil by the gradient and/or shim coil.

In direct contrast, in the smaller and more compact MRI probes used in systems such as the interventional MRI/MRT systems of the present invention, the problem of loading of the transmitting RF coil is more difficult to solve because the region between the permanents magnets (such as the regions 14 and 114 of FIGS. 4 and 17, respectively) is small due to limitations on the allowable size of the permanent magnet assemblies. Thus, the use of external gradient and shim coils of the present invention which are placed outside the region between the magnet assemblies, has the advantage of making more space available between the permanent magnet assemblies as well as reducing the loading of the transmitting RF coil for improving the image quality attainable.

It is noted that, while in the MRI probe 150 of FIGS. 16 and 17 the X-gradient coil, Y-gradient coil, Z-gradient coil and shim coils are included within the multi-layer printed circuit assemblies 174 and 172 which are externally positioned outside the region 114, other preferred embodiments of the present invention are possible in which some of the gradient coils and/or the shim coils are internally positioned within the region between the permanent magnet assemblies 164 and 162.

Figure 18:
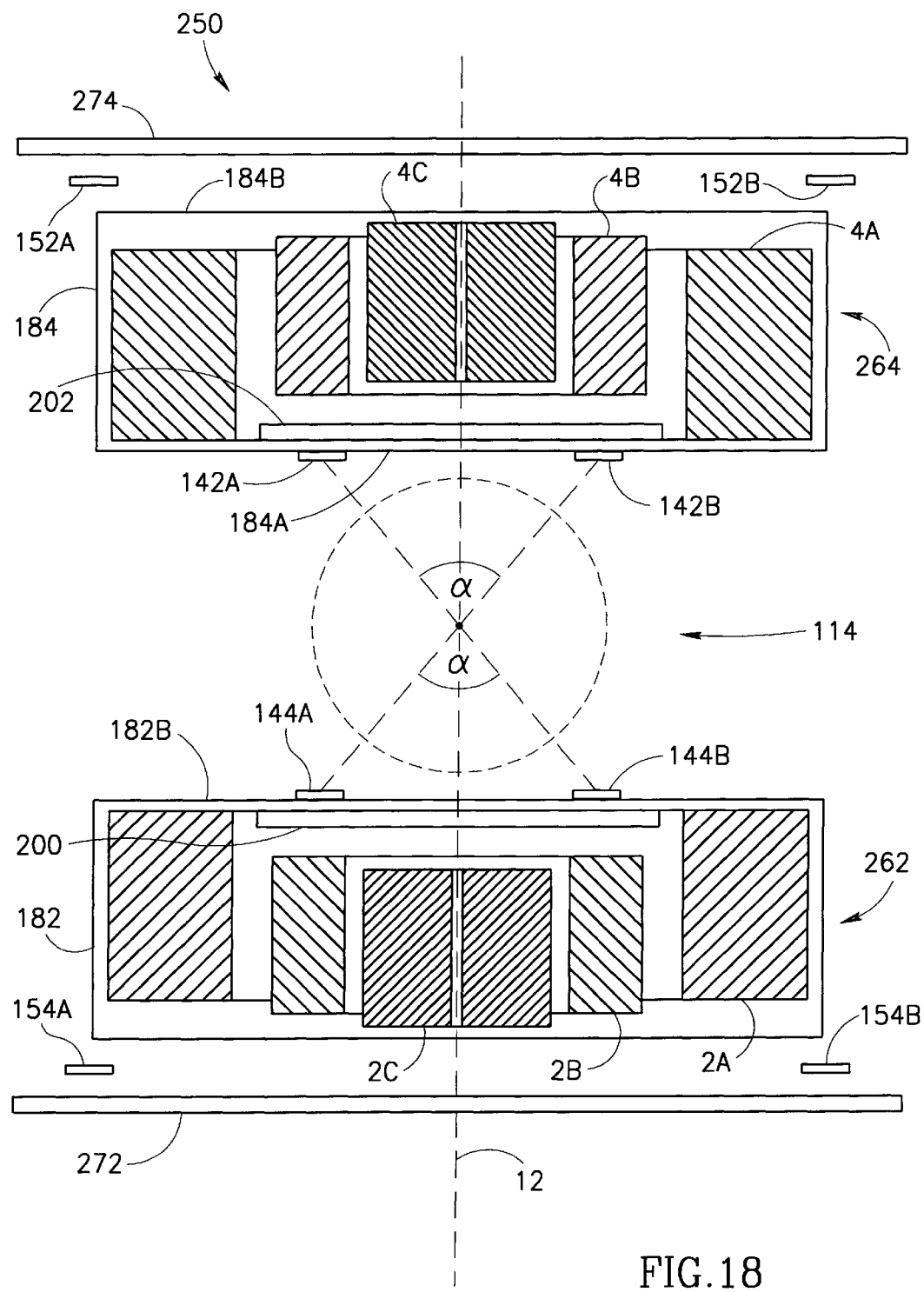
FIG. 18 is a schematic cross section of an MRI probe having an internal Z-gradient coil and external X-gradient and Y-gradient coils, in accordance with another preferred embodiment of the present invention.

Reference is now made to FIG. 18 which is a schematic cross section of an MRI probe 250 having an internal Z-gradient coil and external X-gradient and Y-gradient coils, in accordance with another preferred embodiment of the present invention. The MRI probe 250 includes two external multi-layer printed circuit assemblies 274 and 272 and two permanent magnet assemblies 262 and 264. The multi-layer printed circuit assemblies 274 and 272 are similar in construction to the multi-layer printed circuit assemblies 174 and 172 of FIG. 17, except that they do not include a Z-gradient coil. Thus, each of the multi-layer printed circuit assemblies 274 and 272 includes an X-gradient coil (not shown), a Y-gradient coil (not shown) and a shim coil (not shown).

The two permanent magnet assemblies 262 and 264 are similar to the two permanent magnet assemblies 162 and 164 of FIG. 17, except that permanent magnet assembly 262 also includes a printed circuit board 200 which includes a Z-gradient coil (not shown) disposed in the space between the housing 182 and the annular permanent magnets 2B and 2C, and permanent magnet assembly 264 also includes a printed circuit board 202 which includes a Z-gradient coil (not shown) disposed in the space between the housing 182 and the annular permanent magnets 4B and 4C.

The placement of the printed circuit boards 200 and 202 inside the housings 182 and 184, respectively, does not diminish the space available between the surfaces 182B and 184A, leaving the region 114 free for positioning an organ or body part for imaging and enabling access of surgical instruments to the organ or body part.

Figure 19:
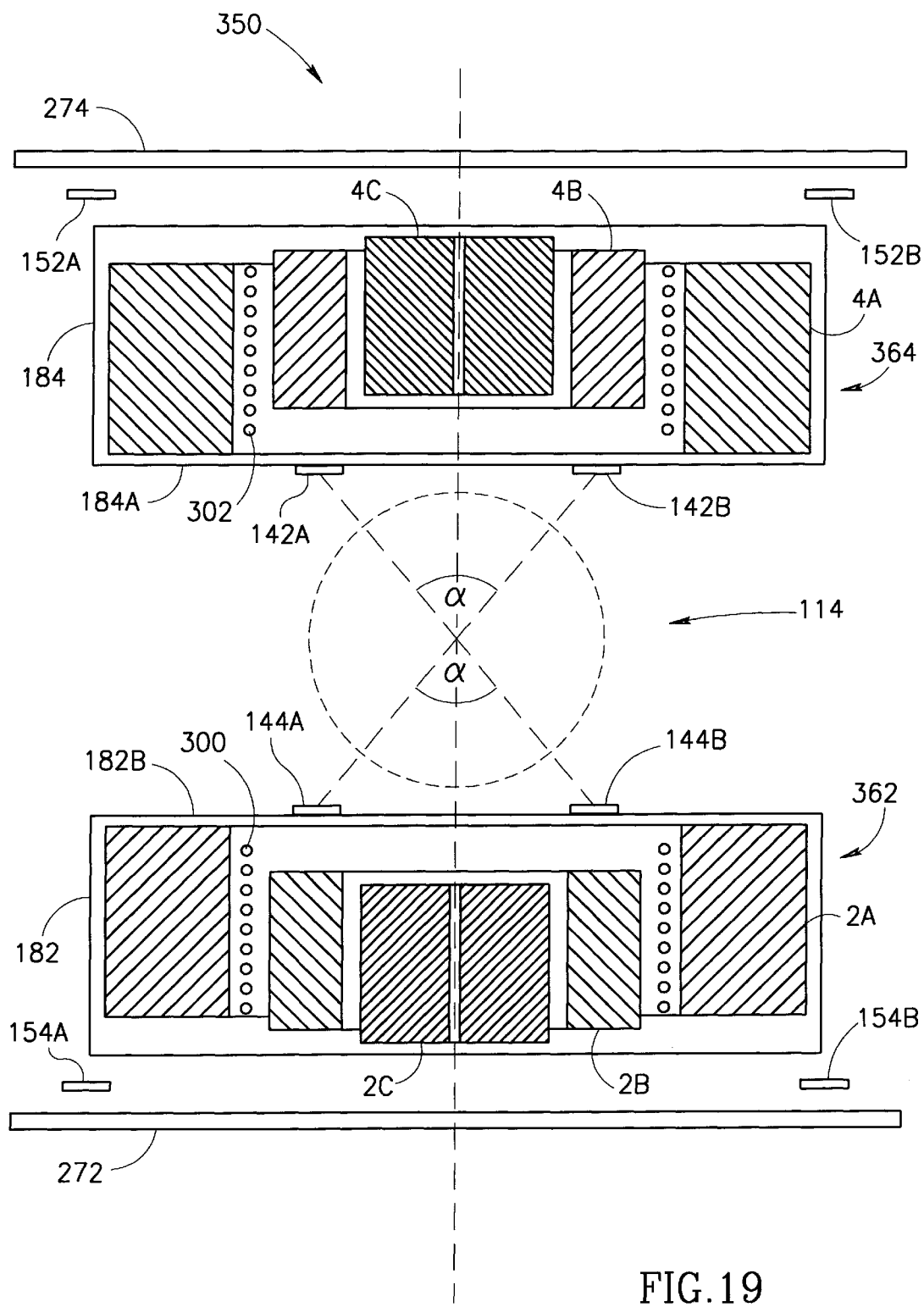
FIG. 19 is a schematic cross section of an MRI probe having an internal Z-gradient coil and external X-gradient and Y-gradient coils, in accordance with yet another preferred embodiment of the present invention.

Reference is now made to FIG. 19 which is a schematic cross section of an MRI probe 350 having an internal Z-gradient coil and external X-gradient and Y-gradient coils, in accordance with yet another preferred embodiment of the present invention.

The MRI probe 350 includes the multi-layer printed circuit assemblies 274 and 272 of FIG. 18 and permanent magnet assemblies 362 and 364. The permanent magnet assemblies 362 and 364 are identical to the permanent magnet assemblies 162 and 164 of FIG. 17 in all respects except that the permanent magnet assembly 362 also includes an extended Z-gradient coil 300 and that that the permanent magnet assembly 364 also includes an extended Z-gradient coil 302. The Z-gradient coil 300 is concentrically disposed between the annular permanent magnets 2A and 2B and the Z-gradient coil 302 is concentrically disposed between the annular permanent magnets 4A and 4B.

The placement of the Z-gradient coils 300 and 302 inside the housings 182 and 184, respectively, does not diminish the space available between the surfaces 182B and 184A, leaving the region 114 free for positioning an organ or body part for imaging and enabling access of surgical instruments to the organ or body part.

It is noted that, the z-gradient coils 300 and 302 may be shaped as a helical coil with a circular cross section or as an extended coil having another suitable cross section such as a regular polygonal cross section (not shown). The pitch of the coil windings may vary in accordance with the required gradient parameters.

It is further noted that, while the z-gradient coils 300 and 302 of FIG. 19 are shown as even-pitched helical coils for the sake of clarity of illustration, the z-gradient coils 300 and 302 may have a variable pitch such that the number of coil windings per unit length may vary along the coil as is well known in the art.

It is further yet noted that, the Z-gradient coil 65 of FIG. 10 and the Z-gradient coils 300 and 302 of FIG. 19 may also be shaped as extended coils having variable diameter windings, such that some portions of the coil may have a different diameter than other portions of the coil.

Furthermore, it is noted that, for the sake of clarity of illustration, the receiving RF coil 175 of FIG. 16 is not shown in FIGS. 17–19

It is still further noted that, while the transmitting RF coil 140 of the MRI probe 150 is a linearly polarizing, other types of transmitting RF coils may be used.

Figure 20:
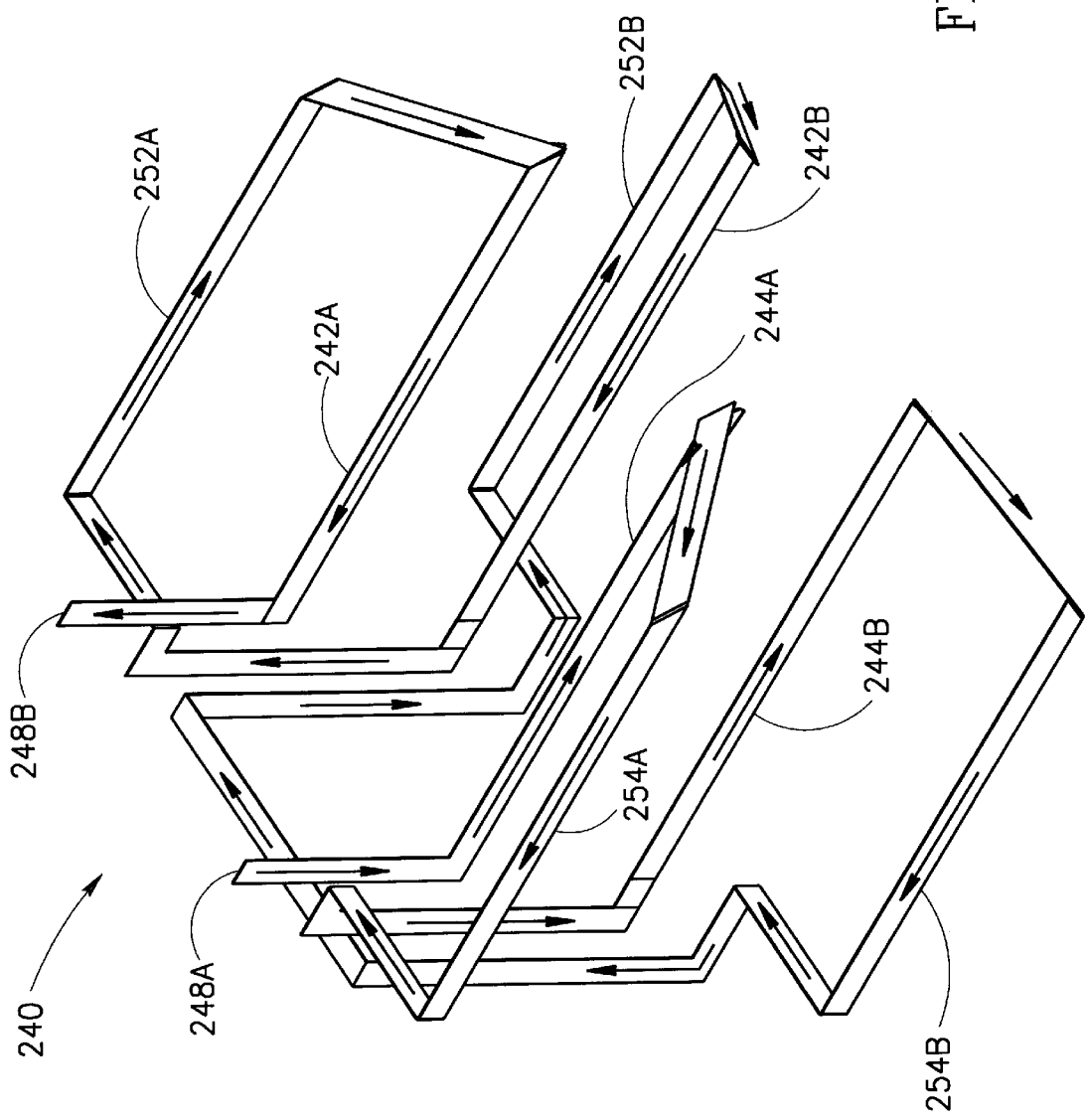
FIG. 20 is a schematic isometric view illustrating an RF coil combinable with the RF coil of FIG. 15 to form a circularly polarizing RF transmitting coil assembly for use with an MRI probe, in accordance with another embodiment of the present invention.
Figure 21:
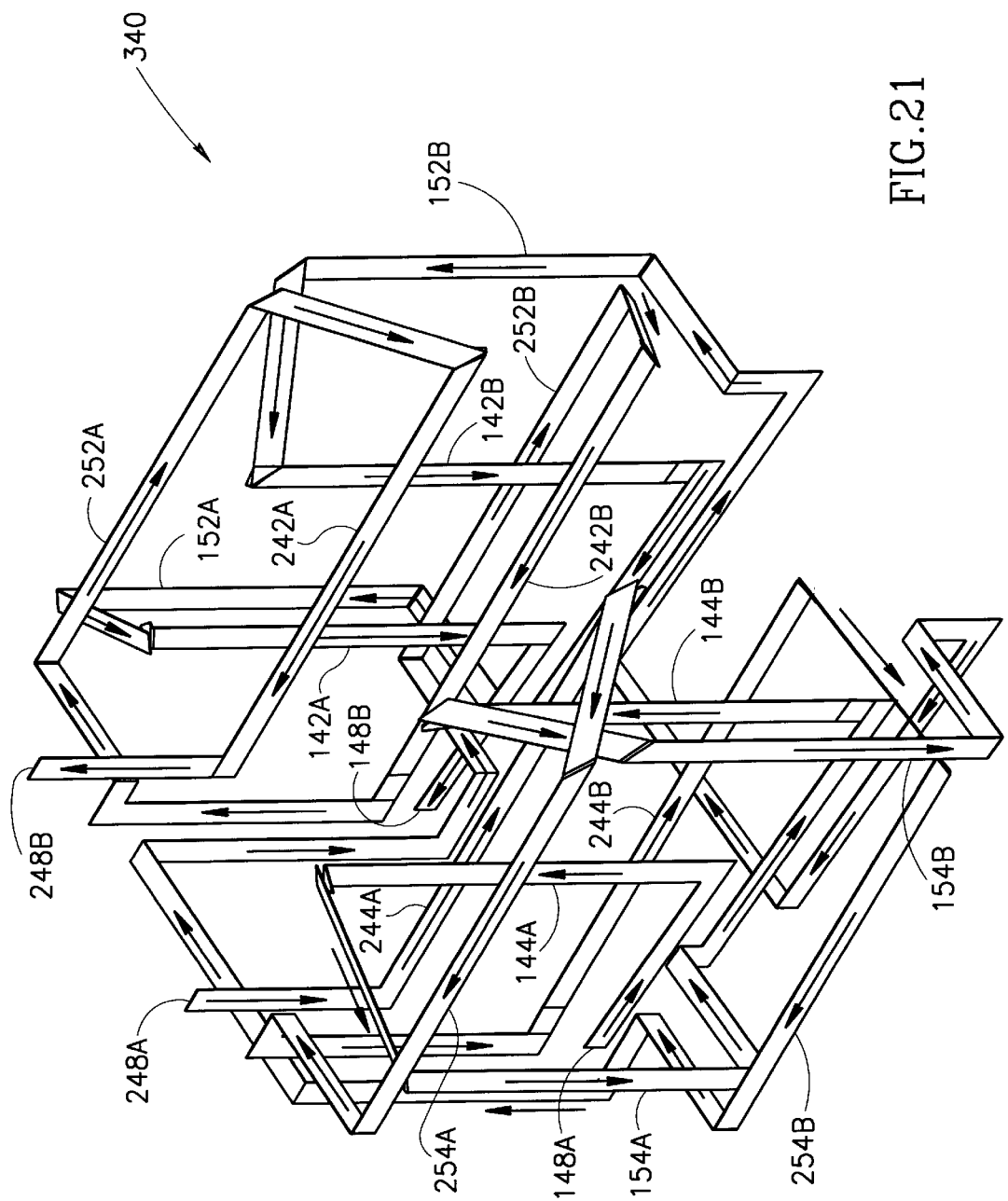
FIG. 21 is a schematic isometric view illustrating a circularly polarizing RF transmitting coil assembly, assembled from the RF coil of FIG. 15 and the RF coil of FIG. 21.

Reference is now made to FIGS. 20 and 21. FIG. 20 is a schematic isometric view illustrating an RF coil 240 combinable with the RF coil 140 of FIG. 15 to form a circularly polarizing RF transmitting coil assembly for use with an MRI probe, in accordance with another embodiment of the present invention. FIG. 21 is a schematic isometric view illustrating a circularly polarizing RF transmitting coil assembly, assembled from the RF coil of FIG. 15 and the RF coil of FIG. 20.

The RF coil 240 of FIG. 20 is preferably made of a folded flat copper ribbon conductor but can be made of any other suitably shaped electrically conducting material capable of carrying the required electrical currents. The coil 240 includes four front conductor portions 242A, 242B, 244A and 244B. When the RF coil 240 is electrically energized, an electrical current flows therethrough in the direction indicated by the arrows. The four front conductors 242A, 242B, 244A and 244B effectively form an open Helmholz coil configuration.

The coil 240 also includes four current return conductor portions 252A, 252B, 254A and 254B. It is noted that, while the front conductor portions 142A, 142B, 144A and 144B and the current return conductor portions 152A, 152B, 154A and 154B of the transmitting RF coil 140 (FIG. 15) are aligned vertically, the front conductor portions 242A, 242B, 244A and 244B and the current return conductor portions 252A, 252B, 254A and 254B of the RF coil 240 are horizontally aligned.

The coil terminals 248A and 248B are electrically connected to a suitable RF amplifier (not shown) for energizing the coil 240.

The transmitting RF coil 240 of FIG. 20 may replace the transmitting RF coil 140 of the MRI probe 150 (FIG. 16). However, the transmitting RF coils 140 and 240 can also be combined to form the circularly polarizing transmitting RF coil 340 of FIG. 21.

In the transmitting RF coil 340, the front conductor portions 242A and 242B are aligned orthogonal to the front conductor portions 142A and 142B. The four front conductor portions 242A, 242B, 142A and 142B are disposed adjacent to the surface 184A of the permanent magnet assembly 164 (not shown) of the MRI probe. The front conductor portions 244A and 244B are aligned orthogonal to the front conductor portions 144A and 144B. The four front conductor portions 244A, 244B, 144A and 144B are disposed adjacent to the surface 182A of the permanent magnet assembly 162 (not shown) of the MRI probe.

Care is taken to prevent any electrical contact between any portions of the RF coil 140 and portions of the RF coil 240, in order to prevent short circuits. This may be done by isolating the surface of the RF coils 140 and 240 by a layer or coat of an insulating material (not shown) or by separating regions of possible contact with pieces of electrically non-conducting material.

The general design of circularly polarizing transmitting RF coils is known in the art as a quadrature-hybrid RF coil type. However, the inventors of the present invention have noted that by positioning some or all of the gradient coils and shim coils outside of the open region 114 the load on the transmitting RF coils can be significantly reduced and the RF coil efficiency is improved. Additionally, the positioning of the current return conductor portions 154A, 154B, 254A, 254B, 152A, 152B, 252A and 252B of the circularly polarizing transmitting RF coil 340 outside of the open region 114 additionally improves the RF coil efficiency by significantly increasing the distance of the current return conductor portions 154A, 154B, 254A, 254B, 152A, 152B, 252A and 252B from the open region 114.

It is noted that, while the transmitting RF coils 140 and 340 of FIGS. 15, 16 and 21 which are useful with the MRI probes of the present invention have the advantage that portions thereof such as the current return conductor portions are disposed outside the open region 114 to increase the space available therewithin, many other designs of linearly or circularly polarizing transmitting RF coils may be possibly used with MRI probes having external gradient coils disposed outside of the open region 114, which are within the scope and spirit of the present invention. For example, transmitting RF coils (not shown) in which all of the transmitting RF coil or coils are positioned within the open region 114 may also be used in embodiments of the present invention.

Figure 22:
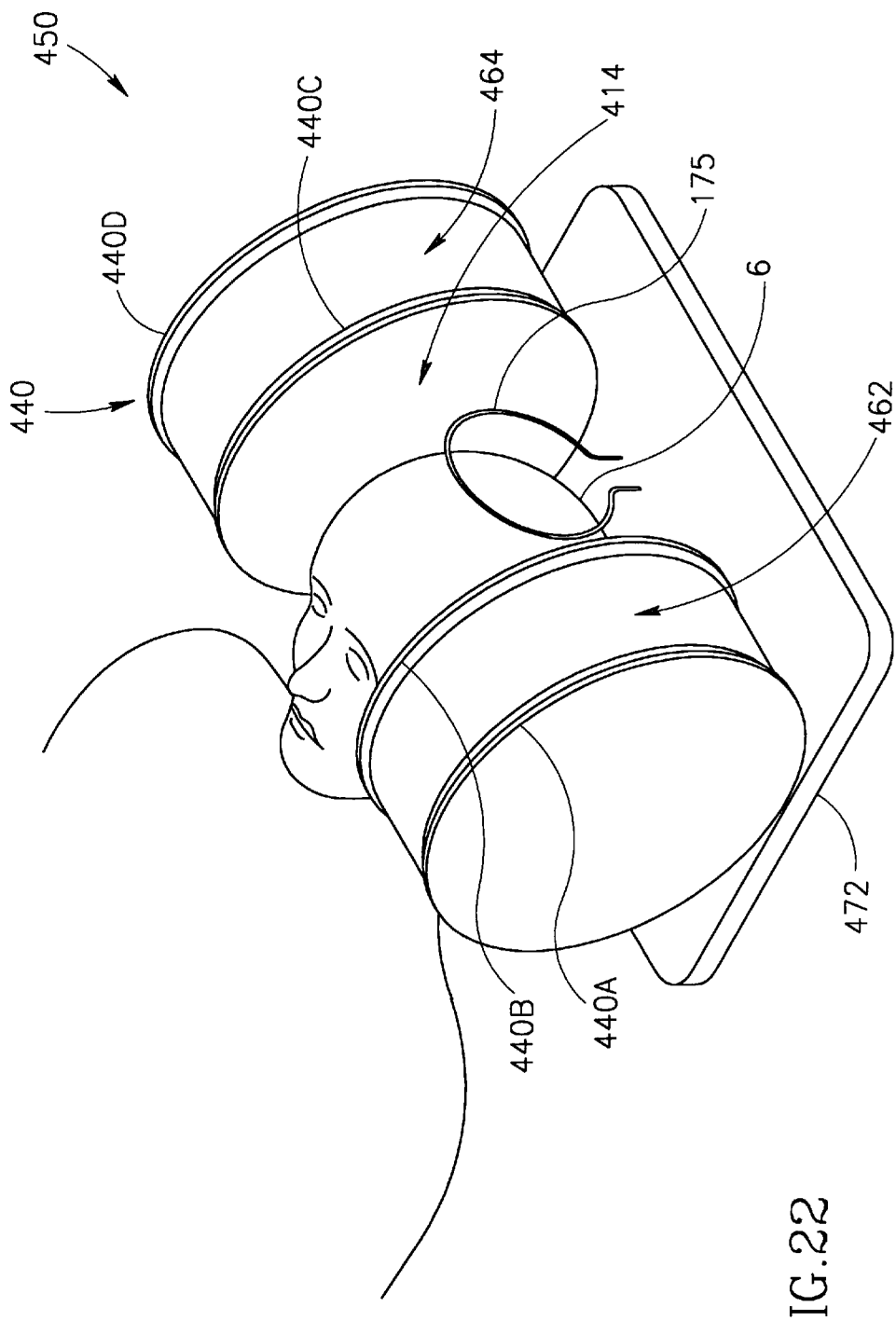
FIG. 22 is a schematic isometric view illustrating an MRI probe having external X, Y and Z-gradient coils, in accordance with still another preferred embodiment of the present invention.

Reference is now made to FIG. 22 which is a schematic isometric view illustrating an MRI probe 450 having external X, Y and Z-gradient coils, in accordance with still another preferred embodiment of the present invention.

The MRI probe 450 include two opposed permanent magnet assemblies 462 and 464 defining an open region 414 therebetween. The permanent magnet assemblies 462 and 464 may be attached to or supported by one or more supporting structures such as a supporting frame (not shown for the sake of clarity of illustration) which is designed to enable access to the region 414 and to the head of the patient 6.

An organ or body part such as the head of a patient 6 may be positioned within the open region 414 for imaging. The permanent magnet assemblies 462 and 464 may be similar in design to the permanent magnet assemblies 162 and 164 of FIG. 16 but may also be any suitably designed pair of permanent magnet assemblies for providing a region of substantially homogenous magnetic field therebetween. The MRI probe 450 further includes a transmitting RF coil 440 which includes four portions 440a, 440B, 440C and 440D. the portions 440a, 440B, 440C and 440D of the RF coil 440 are printed circuit board assemblies which are suitably electrically connected (connections not shown), the copper conductors (not shown) included in the printed circuit board assemblies 440a, 440B, 440C and 440D are shaped in a similar way to the conductors of the RF coil 140 of FIG. 15. However, the transmitting RF coils 140or 340 of FIGS. 15 and 21, respectively, may also be used instead of the RF coil 440. The printed circuit board assemblies 440A and 440D may also include shim coils (not shown), however, the shim coils (not shown) may also be a pair of separate coils each disposed opposing one of the printed circuit board assemblies 440A and 440D at a distance therefrom.

The MRI probe 450 further includes a receiving RF coil 175 and a multi-layer printed circuit assembly 472.

The multi-layer printed circuit assembly 472 is disposed underneath the permanent magnet assemblies 462 and 464 and outside the open region 414. Thus, the region 414 may be relatively freely accessed.

The multi-layer printed circuit assembly 472 includes three printed circuits (not shown) including a X-gradient coil, a Y-gradient coil and a Z-gradient coil. It is noted that, since the relative positioning of the multi-layer printed circuit assembly 472 is different than the positioning of the multi-layer printed circuit assemblies 172 and 174 of FIG. 16, the design of the gradient coils is adapted to suit the different position of the coils relative to the direction of the main magnetic field. The positioning of the multi-layer printed circuit assembly 472 outside the open region 414 has the advantages of making more space available in the open region 414 and of reducing the loading of the RF transmitting coil 440 by increasing the spatial separation between the conducting gradient coil surfaces of the multi-layer printed circuit assembly 472 and the transmitting RF coil 440.

It is noted that while the MRI probes of the preferred embodiments disclosed hereinabove include a pair of opposing permanent magnet assemblies with an open region therebetween wherein an organ or body part is disposed in the open region between the pair of permanent magnet assemblies, other preferred embodiments of the present invention may be implemented using a single magnet assembly.

Figure 23:
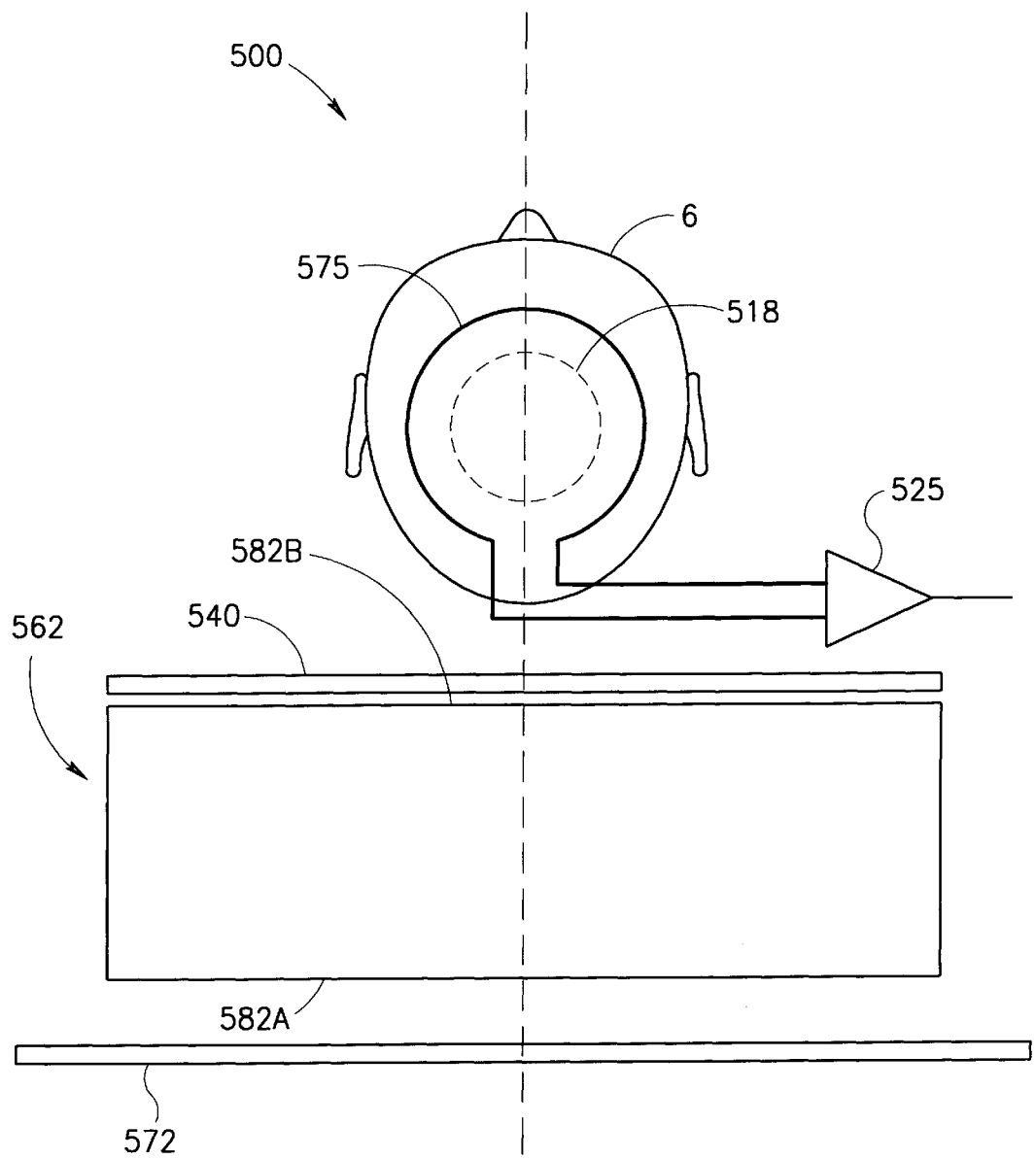
FIG. 23 is a schematic diagram of an MRI probe having a single permanent magnet assembly, in accordance with yet another preferred embodiment of the present invention.

Reference is now made to FIG. 23 which is a schematic cross section of an MRI probe 500 having a single permanent magnet assembly, in accordance with yet another preferred embodiment of the present invention.

The MRI probe 500 includes a single permanent magnet assembly 562 having a first surface 582A and a second surface 582B opposing the first surface 582A. The permanent magnet assembly 562 may be constructed by using various different designs. For example, the permanent magnet assembly 562 may be constructed from a plurality of concentric annular permanent magnets as disclosed in detail in co-pending U.S. Pat. No. 5,900,793 to Katznelson et al. However, the permanent magnet assembly 562 may also be implemented using other methods and designs adapted to provide a volume of substantially homogenous magnetic field 518 extending beyond the surface 582B of the permanent magnet assembly 562. The particular design parameters of the permanent magnet assembly may depend, inter alia, on the desired dimensions of the volume 518, the desired intensity of the magnetic field within the volume 518 and the distance between the volume 518 and the surface 582B.

The MRI probe 500 further includes a multi-layer printed circuit assembly 572. The multi-layer printed circuit assembly 572 is disposed opposing the surface 582A of the permanent magnet assembly 562 on the side of the permanent magnet assembly 562 which is opposite the side facing the volume 518. The multi-layer printed circuit assembly 572 includes three printed circuits (not shown) including a X-gradient coil, a Y-gradient coil and a Z-gradient coil. The multi-layer printed circuit assembly 572 may also include a shim coil (not shown) for active shimming of the main magnetic field.

The MRI probe 500 further includes a transmitting RF coil 540. The transmitting RF coil 540 is disposed between the surface 582B and the volume 518. The MRI probe 500 further includes a receiving RF coil 575 suitably connected to an RF amplifier 525 such as a low noise RF amplifier.

An organ or body part which is to be imaged, such as the head of a patient 6 can be positioned above the surface 582B and the RF coil 540 such that at least part of the head 6 is positioned within the volume 518.

An advantage of the MRI probe 500 is that the gradient coils and shim coils which are included in the multi-layer printed circuit assembly 572 are disposed away from the region above the surface 582B and therefore do not restrict access of the imaged organ to the volume 518.

Another advantage of the configuration of the multi-layer printed circuit assembly 572 within the MRI probe 500 is that the gradient and shim coils (not shown) of the multi-layer printed circuit assembly 572 are positioned away from the transmitting RF coil 540 and the receiving RF coil 575 and therefore reduce the loading of the transmitting RF coil 540 and of the receiving RF coil 575 by the gradient coils (not shown) within the multi-layer printed circuit assembly 572, thereby improving image quality.

It is noted that, other configurations of the transmitting RF coil 540 are possible in which a portion of the transmitting RF coil is disposed between the surface 582B and the volume 518 and another portion of the RF transmitting coil is disposed between the surface 582A and the multi-layer printed circuit assembly 572.

It will be appreciated by those skilled in the art that the single permanent magnet assembly 562 of FIG. 23 has to be optimized to achieve a predetermined volume of substantially homogenous magnetic field. Thus, three gradient coils, namely the X, Y and Z gradient coils (not shown) are needed within the multi-layer printed circuit assembly 572 to actively generate the three orthogonal magnetic field gradients required during the imaging sequences.

While such optimization methods for single magnet assemblies are known in the art, there is an alternative approach in which the single magnet assembly is designed to provide a fixed magnetic field gradient, for example along the z-axis. For example, U.S. Pat. No. 5,390,673 to Kikinis discloses a bar-like single magnet having a fixed magnetic field gradient along the longitudinal axis of the bar-like magnet.

The inventors of the present invention have noted that such permanent magnet assemblies having a fixed magnetic field gradient may also be used in accordance with the present invention.

Figure 24:
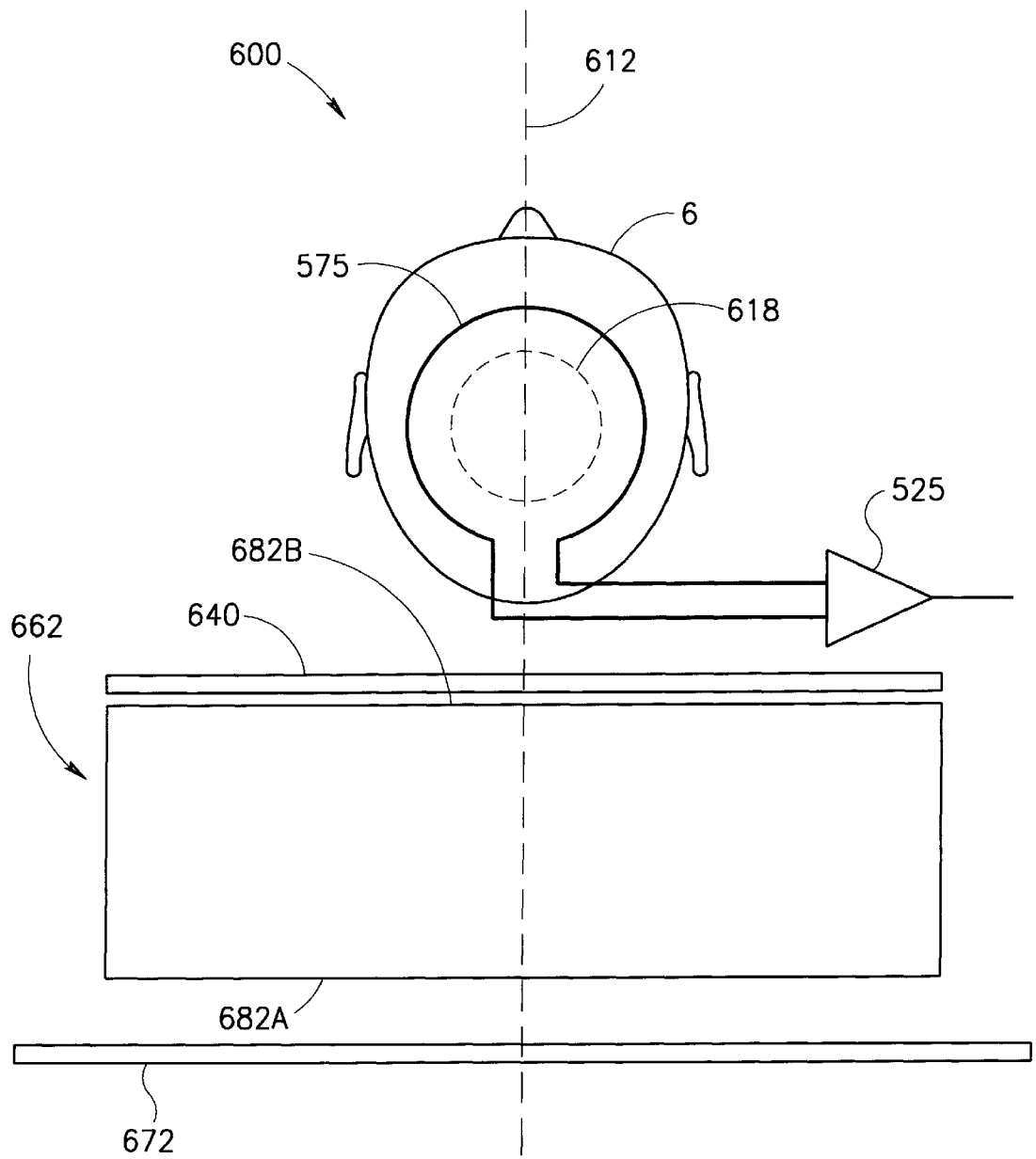
FIG. 24 is a schematic diagram illustrating an MRI probe having a fixed magnetic field gradient, in accordance with another preferred embodiment of the present invention.

Reference is now made to FIG. 24 which is a schematic diagram illustrating an MRI probe having a fixed magnetic field gradient, in accordance with another preferred embodiment of the present invention.

The MRI probe 600 includes a single permanent magnet assembly 662 having a first surface 682A and a second surface 682B opposing the first surface 682A. The permanent magnet assembly 662 may be constructed by using various different designs. For example, the permanent magnet assembly 662 may be constructed from as a plurality of concentric annular permanent magnets as disclosed in detail in co-pending U.S. Pat. No. 5,900,793 to Katznelson et al., now U.S. Pat. 5,900,793 wherein the exact dimensions, shapes, magnetic field strength and relative positioning of the annular permanent magnets in the assembly are designed to obtain a fixed magnetic field gradient extending along the axis 612. This fixed Z-gradient varies substantially linearly within the predetermined volume 618 along the axis 612. The magnetic field is substantially uniform in any plane which is included within the volume 618 and is orthogonal to the axis 612 within the volume 618.

However, the permanent magnet assembly 662 may also be implemented using other methods and designs such as the design of Kikinis. The particular design parameters of the permanent magnet assembly may depend, inter alia, on the desired dimensions of the volume 618, the desired intensity of the magnetic field within the volume 618 and the distance between the volume 618 and the surface 682B.

The MRI probe 600 further includes a multi-layer printed circuit assembly 672. The multi-layer printed circuit assembly 672 is disposed opposing the surface 682A of the permanent magnet assembly 662 on the side of the permanent magnet assembly 662 which is opposite the side facing the volume 618. In contrast to the multi-layer printed circuit assembly 572 of FIG. 23 which includes three gradient coils, the multi-layer printed circuit assembly 672 of FIG. 24 includes two printed circuits (not shown) including an X-gradient coil, and a Y-gradient coil. The multi-layer printed circuit assembly 672 may also include a shim coil (not shown) for active shimming of the magnetic field.

The MRI probe 600 further includes a transmitting RF coil 640, The transmitting RF coil 640 is disposed between the surface 682B and the volume 618. The MRI probe 600 further includes a receiving RF coil 575 suitably connected to an RF amplifier 525 such as a low noise RF amplifier.

An organ or body part which is to be imaged, such as the head of a patient 6 can be positioned above the surface 682B and the transmitting RF coil 540 such that at least part of the head 6 is positioned within the volume 618.

It is noted that ,while in the embodiment of FIG. 24 both the X and Y gradient coils (not shown) within the multi-layer printed circuit assembly 672 are positioned opposing the surface 682A, in other embodiments only one of the X or Y gradient coils may be so positioned.

The advantages of the disclosed positioning of one or more of the gradient coils of the MRI probe 600 are similar to the advantages disclosed in detail for the MRI probe 500 hereinabove.

It is noted that, while the permanent magnet assemblies used within the MRI probes of FIGS. 4, 8–10, 14, 16–19, 22 and 23 are designed using concentric annular permanent magnets as disclosed in detail in co-pending U.S. Pat. No. 5,900,793 to Katznelson et al., many other types of magnet assemblies can be used which are within the scope of the present invention. For example, the annular permanent magnets used in the construction of the permanent magnet assemblies may be concentric polygonal annular shapes, or a plurality of elliptically shaped annuli having two common axes passing through the foci of the individual elliptical annuli.

Additionally, other configurations of permanent magnets may be used such as solid cube like or bar like permanent magnets or any other types of yoked or-non yoked magnets which are constructed to avoid the development of substantial eddy currents therewithin by the gradient coils. Such designs may use permanent magnetic materials having low electrical conductivity or may use magnetic and/or yoke structures which are segmented and are attached or glued by non-electrically conductive materials or glues. The development of eddy currents within yoke structures having high electrical conductivity may be reduced for enabling their use with the external gradient coils of the present invention by slotting the yoked structures with spiral or other types of slots to reduce possible current development. Thus, the various forms of the external gradient positioning of the present invention may be adapted for use with differently designed magnet assemblies configured singly, or as opposed pairs of magnetic assemblies having an open region therebetween.

It is further noted that, while in the preferred embodiments of the present invention, the multi-layer printed circuit assemblies 52, 54, 72, 74, 64, 78, 172, 174, 272, 274, 200, 202, 472 and 572 include therewithin hollow conduits (not Shown) for flowing a coolant fluid such as water therein, in other preferred embodiments of the present embodiments, the multi-layer printed circuit assemblies may be devoid of such channels.

It is still further noted that, in accordance with yet other preferred embodiments of the present invention, screening devices such as conducting metal mesh or grid may be inserted between various components of the MRI probes for improving RF screening. For example, in the MRI probe 150 of FIGS. 16 and 17, a suitable circular copper mesh piece (not shown) of a diameter similar to the diameter of the multi-layer printed circuit assembly 172 may be disposed between the surface 182A and the multi-layer printed circuit assembly 172, while another suitable circular copper mesh piece (not shown) of a diameter similar to the diameter of the multi-layer printed circuit assembly 174 may be disposed between the surface 184B and the multi-layer printed circuit assembly 174. Similarly, pieces of suitable copper mesh (not shown) may be used for screening the entire surface of the permanent magnet assembly 162 except the surface 182B thereof, and the entire surface of the permanent magnet assembly 164 except the surface 184A thereof.

It is also noted that for the sake of clarity of illustration in many of the drawing Figures, the transmitting and receiving RF amplifiers, and the precise electrical connections between the portions of the RF coils are not shown.

It is further noted that, preferably, in all the embodiments of the MRI probes illustrated in FIGS. 4, 8–10, and 16–19, all the corresponding pairs of the gradient coils and shim coils of the MRI probe are electrically connected in series (the connections are not shown for the sake of clarity of illustration). For example, the Z-gradient amplifier (not shown) of the MRI probe 150 of FIG. 16 is electrically connected to the current input terminal (not shown) of the z-gradient coil (not shown) included within the multi-layer printed circuit assembly 172, the current output terminal (not shown) of the z-gradient coil of the multi-layer printed circuit assembly 172 is electrically connected to the current input terminal (not shown) of the z-gradient coil (not shown) included within the multi-layer printed circuit assembly 174, and the current output terminal (not shown) of the z-gradient coil of the multi-layer printed circuit assembly 174 is electrically connected to the Z-gradient amplifier, completing the circuit. Thus the z-gradient amplifier energizes both of the complementary z-gradient coils of the opposing multi-layer printed circuit assemblies 172 and 174, simultaneously. A similar in-series electrical connection scheme is used for the pairs of complementary x-gradient coils (not shown) y-gradients (not shown) and Shim coils (not shown). However, other methods of connection of the complementary pairs of gradient and shim coils may also be used, such as the use of pairs of amplifiers (not shown), each of which activates one coil of the complementary pairs of coils.

While embodiments of the present invention have been described so as to enable one skilled in the art to practice the present invention, the preceding description is intended to be exemplary and should not be construed as limiting the scope of the invention.

What is claimed is:

1. Electromagnetic apparatus for use in an MRI device, the apparatus comprising:

a permanent magnet assembly having a first surface defining a first side of said permanent magnet assembly and a second surface defining a second side of said permanent magnet assembly opposed to said first side, for producing a predetermined volume of substantially uniform magnetic field extending in a first direction beyond said first surface;

an energizable transmitting RF coil for producing an RF electromagnetic field within said volume, at least a portion of said RF coil is positioned adjacent said first surface of said permanent magnet assembly;

an energizable z-gradient coil for producing a magnetic field gradient extending within said volume in said first direction parallel to a first axis;

an energizable x-gradient coil for producing a magnetic field gradient extending within said volume parallel to a second axis orthogonal to said first axis; and an energizable y-gradient coil for producing a magnetic field gradient extending within said volume parallel to a third axis orthogonal to said first axis and to said second axis, wherein at least one of said x-gradient coil, y-gradient coil and z-gradient coil is positioned opposing said second surface of said permanent magnet assembly.

2. The apparatus according to claim 1 wherein at least a portion of said transmitting RF coil is positioned on said second side of said permanent magnet assembly opposing said second surface of said permanent magnet assembly to improve the efficiency of said transmitting RF coil.

3. The apparatus according to claim 1 further including at least one energizable shim coil for improving the homogeneity of said substantially uniform magnetic field.

4. The apparatus according to claim 3 wherein said at least one shim coil is a substantially planar coil opposing said second surface of said permanent magnet assembly.

5. The apparatus according to claim 1 wherein said x-gradient coil, said y-gradient coil and said z-gradient coil are substantially planar printed circuits assembled within a substantially planar multi-layer printed circuit assembly, said multi-layer printed circuit assembly is disposed on said second side of said permanent magnet assembly facing said second surface.

6. The apparatus according to claim 5 wherein said multi-layer printed circuit assembly further includes at least one energizable shim coil, said at least one shim coil is a substantially planar printed circuit.

7. The apparatus according to claim 1 further including at least one receiving RF coil positioned on said first side of said permanent magnet assembly and placeable adjacent to an organ or body part to be imaged using said apparatus.

8. The apparatus according to claim 7 wherein said transmitting RF coil is a linearly polarizing RF coil.

9. The apparatus according to claim 7 wherein said transmitting RF coil is a circularly polarizing RF coil.

10. The apparatus according to claim 1 wherein said permanent magnet assembly comprises:

a first annular permanent magnet having an upper and a lower surface thereof, said upper surface of said first annular permanent magnet being of a first magnetic polarity and said lower surface of said first annular permanent magnet being of a second magnetic polarity, said first annular permanent magnet having an inside diameter, said first permanent magnet having at least a portion of said upper surface of said first annular magnet lying in a first plane and providing a first magnetic field in said predetermined volume, said first magnetic field having a zero rate of change in said first direction at a first point;

at least a second annular permanent magnet having an upper and a lower surface thereof, said upper surface of said at least second annular permanent magnet being of said first magnetic polarity and said lower surface of said at least second annular permanent magnet being of said second magnetic polarity, said at least second annular permanent magnet having an outside diameter which is smaller than said inside diameter of said first annular permanent magnet, said at least second annular permanent magnet providing a second magnetic field; and low permeability material interconnecting said first annular permanent magnet with said at least second annular permanent magnet, so that at least a portion of said upper surface of said at least second annular permanent magnet is in a second plane spaced from said first plane, whereby said second magnetic field is superimposed upon said first magnetic field, in said predetermined volume, having a zero rate of change in said first direction at a second point different from said first point.

11. The apparatus according to claim 10 wherein said first axis passes through the center points of said first annular permanent magnet and said at least second annular permanent magnet.

12. The apparatus according to claim 10 wherein said z-gradient coil is an extended gradient coil concentrically disposed between said first annular permanent magnet and said at least second annular permanent magnet, said z-gradient coil has a longitudinal axis coincident with said first axis.

13. The apparatus according to claim 10 wherein said first annular permanent magnet and said at least second annular permanent magnet are rare-earth permanent magnets.

14. The apparatus according to claim 13 wherein said rare-earth permanent magnets are neodimium-iron-boron alloy permanent magnets.

15. The apparatus according to claim 10 wherein at least one of said first annular permanent magnet and said at least second annular permanent magnet comprises a plurality of segments attached to adjacent segments using an electrically non-conductive adhesive.

16. The apparatus according to claim 15 wherein said segments are equiangular segments.

17. The apparatus according to claim 15 wherein said segments have a trapezoidal cross-section in a plane orthogonal to said first direction.

18. Electromagnetic apparatus for use in an MRI device, the apparatus comprising:

a permanent magnet assembly having a first surface and a second surface for producing a predetermined volume having a magnetic field varying substantially linearly along a first axis, said volume extending in a first direction beyond said first surface along said first axis, said magnetic field being substantially uniform in any plane included within said predetermined volume and orthogonal to said first direction within said predetermined volume;

an energizable transmitting RF coil for transmitting RF radiation, said RF coil having at least one portion thereof positioned opposing said first surface of said permanent magnet assembly;

an energizable x-gradient coil for producing a magnetic field gradient along a second axis orthogonal to said first axis; and an energizable y-gradient coil for producing a magnetic field gradient along a third axis orthogonal to said first axis and to said second axis, wherein at least one of said x-gradient coil and y-gradient coil is positioned opposing said second surface of said permanent magnet assembly.

19. The apparatus according to claim 18 further including at least one receiving RF coil positioned on said first side of said permanent magnet assembly and placeable adjacent to an organ or body part to be imaged using said apparatus.

20. A method for constructing an electromagnetic apparatus for use in an MRI device, the method comprising the steps of:

providing a permanent magnet assembly having at least a first surface defining a first side of said permanent magnet assembly and a second surface defining a second side of said permanent magnet assembly opposed to said first side, for producing a predetermined volume of substantially uniform magnetic field extending in a first direction beyond said first surface;

providing an energizable transmitting RF coil for producing an RF electromagnetic field within said volume;

positioning at least a portion of said transmitting RF coil adjacent said first surface of said permanent magnet assembly;

providing at least one receiving RF coil placeable adjacent to an organ or body part to be imaged for receiving RF signals from said organ or body part;

providing an energizable z-gradient coil for producing a magnetic field gradient extending within said volume in said first direction parallel to a first axis;

providing an energizable x-gradient coil for producing a magnetic field gradient extending within said volume parallel to a second axis orthogonal to said first axis;

providing an energizable y-gradient coil for producing a magnetic field gradient extending within said volume parallel to a third axis orthogonal to said first axis and to said second axis; and positioning at least one of said x-gradient coil, y-gradient coil and z-gradient coil opposite said second surface of said permanent magnet assembly for reducing the loading of said transmitting RF coil and said at least one receiving RF coil by said at least one of said x-gradient coil, y-gradient coil and z-gradient coil.

21. A method for constructing electromagnetic apparatus for use in an MRI device, the method comprising the steps of:

providing a permanent magnet assembly having a first surface and a second surface for producing a predetermined volume having a magnetic field varying substantially linearly along a first axis, said volume extending in a first direction beyond said first surface along said first axis, said magnetic field being substantially uniform in any plane included within said predetermined volume and orthogonal to said first direction within said predetermined volume;

providing an energizable transmitting RF coil for transmitting RF radiation;

positioning said transmitting RF coil such that at least one portion thereof opposes said first surface of said permanent magnet assembly;

providing at least one receiving RF coil placeable adjacent to an organ or body part to be imaged for receiving RF signals from said organ or body part;

providing an energizable x-gradient coil for producing a magnetic field gradient along a second axis orthogonal to said first axis;

providing an energizable y-gradient coil for producing a magnetic field gradient along a third axis orthogonal to said first axis and to said second axis; and positioning at least one of said x-gradient coil and y-gradient coil opposite said second surface of said permanent magnet assembly for reducing the loading of said transmitting RF coil and said at least one receiving RF coil by said at least one of said x-gradient coil and y-gradient coil.

* * * * *